(12) United States Patent
Li et al.

(10) Patent No.: US 12,453,274 B2
(45) Date of Patent: Oct. 21, 2025

(54) DISPLAY PANEL AND DISPLAY APPARATUS WITH LIGHT SHIELDING STRIPS TO REDUCE CROSSTALK BETWEEN SUB-PIXELS

(71) Applicant: BOE TECHNOLOGY GROUP CO., LTD., Beijing (CN)

(72) Inventors: Yang Li, Beijing (CN); Wei Huang, Beijing (CN); Dejiang Zhao, Beijing (CN); Tianhao Lu, Beijing (CN); Yu Tian, Beijing (CN); Qian Jin, Beijing (CN); Qian Sun, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/801,483

(22) PCT Filed: Sep. 2, 2021

(86) PCT No.: PCT/CN2021/116134
§ 371 (c)(1),
(2) Date: Aug. 22, 2022

(87) PCT Pub. No.: WO2023/028933
PCT Pub. Date: Mar. 9, 2023

(65) Prior Publication Data
US 2024/0196715 A1    Jun. 13, 2024

(51) Int. Cl.
*H10K 59/80* (2023.01)
*H10K 59/122* (2023.01)
*H10K 59/38* (2023.01)

(52) U.S. Cl.
CPC ....... *H10K 59/8792* (2023.02); *H10K 59/122* (2023.02); *H10K 59/873* (2023.02); *H10K 59/38* (2023.02)

(58) Field of Classification Search
None
See application file for complete search history.

(56) References Cited

U.S. PATENT DOCUMENTS

| 2006/0011913 A1 | 1/2006 | Yamazaki |
| 2008/0191209 A1 | 8/2008 | Moon |
(Continued)

FOREIGN PATENT DOCUMENTS

| CN | 101246896 A | 8/2008 |
| CN | 104851903 A | 8/2015 |
(Continued)

OTHER PUBLICATIONS

European Patent Office, EESR, Mar. 1, 2024, for EP application 21955477.1.

*Primary Examiner* — Nduka E Ojeh
(74) *Attorney, Agent, or Firm* — HOUTTEMAN LAW LLC

(57) ABSTRACT

Provided are a display panel and a display apparatus with light shielding strips to reduce crosstalk between sub-pixels. The display panel includes a pixel definition layer on a first base substrate and including barriers including first barriers and second barriers, the first barriers and the second barriers defining first accommodating portions; light emitting devices arranged in the first accommodating portions in a one-to-one correspondence; a first encapsulation layer covering the pixel definition layer and the plurality of light emitting devices; a color conversion layer on a side of the first encapsulation layer away from the first base substrate, and including a plurality of light emergent portions; and a first light shielding pattern between the first encapsulation layer and the color conversion layer and including first light shielding strips extending in a first direction and second light shielding strips extending in a second direction.

20 Claims, 13 Drawing Sheets

(56) References Cited

U.S. PATENT DOCUMENTS

| | | | |
|---|---|---|---|
| 2015/0311239 A1 | 10/2015 | Won et al. | |
| 2019/0197282 A1* | 6/2019 | Gong | G06V 40/1329 |
| 2020/0365833 A1* | 11/2020 | Joo | H10K 59/8731 |
| 2020/0395416 A1 | 12/2020 | Bae et al. | |
| 2022/0084999 A1* | 3/2022 | Lee | H10H 20/8515 |
| 2023/0051958 A1* | 2/2023 | Seong | H10H 20/8514 |
| 2024/0049552 A1* | 2/2024 | Kim | H10K 59/38 |

FOREIGN PATENT DOCUMENTS

| | | |
|---|---|---|
| CN | 104871527 A | 8/2015 |
| CN | 111312785 A | 6/2020 |
| CN | 111769109 A | 10/2020 |
| CN | 211857132 A | 11/2020 |
| CN | 112054131 A | 12/2020 |
| CN | 112071969 A | 12/2020 |
| CN | 112837627 A | 5/2021 |
| JP | 2006065305 A | 3/2006 |
| WO | WO2021157787 A1 | 8/2021 |

* cited by examiner

DISPLAY PANEL AND DISPLAY APPARATUS WITH LIGHT SHIELDING STRIPS TO REDUCE CROSSTALK BETWEEN SUB-PIXELS

TECHNICAL FIELD

The present disclosure relates to the field of display technology, and in particular to a display panel and a display apparatus.

BACKGROUND

A display architecture combining a quantum dot layer and an OLED (organic light emitting diode) can realize high color gamut, high resolution and large viewing angle, and is suitable for a large-size self-luminous display apparatus.

SUMMARY

The present disclosure provides a display panel and a display apparatus.

The present disclosure provides a display panel. The display panel includes: a pixel definition layer on a first base substrate, wherein the pixel definition layer includes a plurality of barriers, the plurality of barriers include a plurality of first barriers extending in a first direction and a plurality of second barriers extending in a second direction, the first direction intersects with the second direction, a plurality of first accommodating portions are defined by the plurality of first barriers and the plurality of second barriers, each of the plurality of first barriers has a first top surface away from the first base substrate, and each of the plurality of the second barriers has a second top surface away from the first base substrate; a plurality of light emitting devices provided in and in one-to-one correspondence with the plurality of first accommodating portions, each of the plurality of light emitting devices being configured to emit light of a preset color; a first encapsulation layer covering the pixel definition layer and the plurality of light emitting devices; a color conversion layer on a side of the first encapsulation layer away from the first base substrate, wherein the color conversion layer includes a plurality of light emergent portions, the plurality of light emergent portions are provided in one-to-one correspondence with the plurality of light emitting devices, each of the plurality of light emergent portions is configured to receive light of the preset color and emit light of a same color as the preset color or a different color from the preset color; a first light shielding pattern between the first encapsulation layer and the color conversion layer, wherein an orthographic projection of at least a part of each of the plurality of light emitting devices on the first base substrate does not overlap with an orthographic projection of the first light shielding pattern on the first base substrate; the first light shielding pattern includes a plurality of first light shielding strips extending in the first direction and a plurality of second light shielding strips extending in the second direction, an orthographic projection of the plurality of first light shielding strips on the first base substrate overlaps with an orthographic projection of the plurality of first barriers on the first base substrate, and an orthographic projection of the plurality of second light shielding strips on the first base substrate overlaps with an orthographic projection of the plurality of second barriers on the first base substrate; and a second barrier between any two adjacent light emitting devices arranged in the first direction corresponds to at least one second light shielding strip, and/or a first barrier between any two adjacent light emitting devices arranged in the second direction correspond to at least one first light shielding strip, a width of the first light shielding strip is greater than or equal to a width of a corresponding first top surface, and a width of the second light shielding strip is greater than or equal to a width of a corresponding second top surface.

In some embodiments, each of the plurality of first accommodating portions has a first opening away from the first base substrate, and a width of the first light shielding strip satisfies:

$$W1 \leq W1' + L1*0.4,$$

wherein $W1$ is the width of the first light shielding strip, $W1'$ is a width of the first top surface of the first barrier, and $L1$ is a size of the first opening in the second direction; and
a width of the second light shielding strip satisfies:

$$W2 \leq W2' + L2*0.4,$$

wherein $W2$ is the width of the second light shielding strip, $W2'$ is a width of the second top surface of the second barrier, and $L2$ is a size of the first opening in the first direction.

In some embodiments, the display panel further includes a second encapsulation layer covering the first light shielding pattern.

In some embodiments, the first encapsulation layer includes a plurality of encapsulation sub-layers stacked together, and the second encapsulation layer has a refractive index the same as a refractive index of an encapsulation sub-layer of the plurality of encapsulation sub-layers farthest from the first base substrate.

In some embodiments, a material of the second encapsulation layer and of the encapsulation sub-layer furthest from the first base substrate each includes any one of: silicon oxide, silicon nitride, or silicon oxynitride.

In some embodiments, the second encapsulation layer has a thickness in a range from 0.5 µm to 1 µm.

In some embodiments, the first light shielding pattern has a thickness in a range from 0.5 µm to 1 µm.

In some embodiments, the display panel further includes: a filling layer between the first light shielding pattern and the color conversion layer; and the second light shielding pattern between the color conversion layer and the filling layer, wherein an orthographic projection of the second light shielding pattern on the first base substrate overlaps with an orthographic projection of the plurality of barriers on the first base substrate, and an orthographic projection of at least a part of each of the plurality of light emitting devices on the first base substrate does not overlap with the orthographic projection of the second light shielding pattern on the first base substrate.

In some embodiments, a second encapsulation layer is provided between the first light shielding pattern and the filling layer, and a refractive index of the second encapsulation layer is greater than a refractive index of the filling layer.

In some embodiments, the display panel further includes: an accommodating structure layer, wherein the accommodating structure layer includes: a plurality of first dams extending in the first direction and a plurality of second dams extending in the second direction, the plurality of first dams intersect with the plurality of second dams to define a plurality of second accommodating portions, and the plurality of light emergent portions are provided in and in a one-to-one correspondence with the plurality of second accommodating portions; the second light shielding pattern includes: a plurality of third light shielding strips extending in the first direction and a plurality of fourth light shielding strips extending in the second direction, an orthographic projection of the plurality of third light shielding strips on the first base substrate overlaps with an orthographic projection of the plurality of first dams on the first base substrate, and an orthographic projection of the plurality of fourth light shielding strips on the first base substrate overlaps with an orthographic projection of the plurality of second dams on the first base substrate; and a second dam between any two adjacent light emergent portions in the first direction corresponds to at least one third light shielding strip, and/or a first dam between any two adjacent light emergent portions in the second direction corresponds to at least one fourth light shielding strip.

In some embodiments, each of the plurality of second accommodating portions has a second opening facing the first base substrate, the first dam has a first bottom surface facing the first base substrate, and the second dam has a second bottom surface facing the first base substrate;

a width of the third light shielding strip satisfies:

$$W3' \leq W3 \leq W3'+0.4*L3,$$

wherein W3 is the width of the third light shielding strip, W3' is a width of the first bottom surface of the first dam, and L3 is a size of the second opening in the second direction; and a width of the fourth shading strip satisfies:

$$W4' \leq W4 \leq W4'+0.4*L4,$$

wherein W4 is the width of the fourth light shielding strip, W4' is a width of the second bottom surface of the second dam, and L4 is a size of the second opening in the first direction.

In some embodiments, the second light shielding pattern has a thickness in a range from 0.5 μm to 1 μm.

In some embodiments, the display panel further includes: a second base substrate, the color conversion layer being provided on a side of the second base substrate facing the first base substrate; and a third encapsulation layer on a side of the color conversion layer away from the second base substrate, and used for encapsulating the color conversion layer; wherein the second light shielding pattern is provided between the third encapsulation layer and the filling layer.

In some embodiments, the display panel further includes a fourth encapsulation layer on a side of the second light shielding pattern away from the third encapsulation layer.

In some embodiments, the fourth encapsulation layer and the third encapsulation layer have the same refractive index.

In some embodiments, a material of the fourth encapsulation layer and of the third encapsulation layer each includes any one of: silicon oxide, silicon nitride, or silicon oxynitride.

In some embodiments, the fourth encapsulating layer has a thickness in a range from 0.5 μm to 1 μm.

In some embodiments, the first light shielding pattern and the second light shielding pattern are made of a conductive material; the first light shielding pattern is divided into a plurality of first conductive structures arranged in the second direction, different first conductive structures are insulated and spaced apart from each other; and each of the plurality of first conductive structures extends in the first direction and is also used as a first touch electrode; the second light shielding pattern is divided into a plurality of second conductive structures arranged in the first direction, different second conductive structures are insulated and spaced apart from each other; and each of the plurality of second conductive structures extends in the second direction and is also used as a second touch electrode; and an orthographic projection of each of first touch electrodes on the first base substrate overlaps with an orthographic projection of multiple second touch electrodes on the first base substrate, and an orthographic projection of each of second touch electrodes on the first base substrate overlaps with an orthographic projection of multiple first touch electrodes on the second base substrate.

In some embodiments, the first light shielding pattern is made of a conductive material, the first light shielding pattern is divided into a plurality of conductive structures, and each of the plurality of conductive structures is also used as a self-capacitance electrode.

In some embodiments, the plurality of light emergent portions of the color conversion layer includes: a plurality of red light emergent portions, a plurality of green light emergent portions and a plurality of blue light emergent portions, a material of the red light emergent portions includes a red quantum dot material, a material of the green light emergent portions includes a green quantum dot material, and a material of the blue light emergent portions includes a scattering particle material.

In some embodiments, the display panel further includes: a color filter layer on a side of the color conversion layer away from the first substrate, wherein the color filter layer includes a plurality of color filter portions in one-to-one correspondence with the plurality of light emergent portions, and a color of each of the plurality of color filter portions is the same as a color of light emitted from a corresponding light emergent portion; and a black matrix on a side of the color conversion layer away from the first base substrate, wherein an orthographic projection of at least a part of each of the plurality of light emergent portions on the first base substrate does not overlap with an orthographic projection of the black matrix on the first base substrate.

The present disclosure further provides a display apparatus including the above display panel.

BRIEF DESCRIPTION OF DRAWINGS

The accompanying drawings are intended to provide a further understanding of the present disclosure, constitute a part of the description, and are used to explain the present disclosure together with the following specific embodiments, but not intended to limit the present disclosure. In the drawings.

DETAIL DESCRIPTION OF EMBODIMENTS

To make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are only a few embodiments of the present disclosure, and not all embodiments. All other embodiments, which can be derived by a person skilled in the art from the described embodiments of the present disclosure without creative effort, are within the protection scope of the present disclosure.

The terms used herein to describe the embodiments of the present disclosure are not intended to limit and/or define the protection scope of the present disclosure. For example, unless otherwise defined, technical or scientific terms used herein shall have the ordinary meaning as understood by one of ordinary skill in the art to which the present disclosure belongs. It should be understood that the terms "first", "second", and the like, as used in present disclosure, do not denote any order, quantity, or importance, but rather are used to distinguish one element from another. The singular form "a", "an", "the" or the like does not denote limitation of quantity, but rather denotes the presence of at least one, unless the context clearly dictates otherwise. The word "comprising", "comprises", or the like, means that the element or item appearing before the word "comprising" or "comprises" includes the element or item listed after the word "comprising" or "comprises" and its equivalents, and does not exclude other elements or items. The term "connected", "coupled" or the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

In the following description, when an element or layer is referred to as being "on" or "connected to" another element or layer, it may be directly on another element or layer, connected to another element or layer, or an intervening element or layer may be present. However, when an element or layer is referred to as being "directly on" or "directly connected to" another element or layer, there is no intervening element or layer present. The term "and/or" includes any and all combinations of one or more of the associated listed items.

Figure 1:
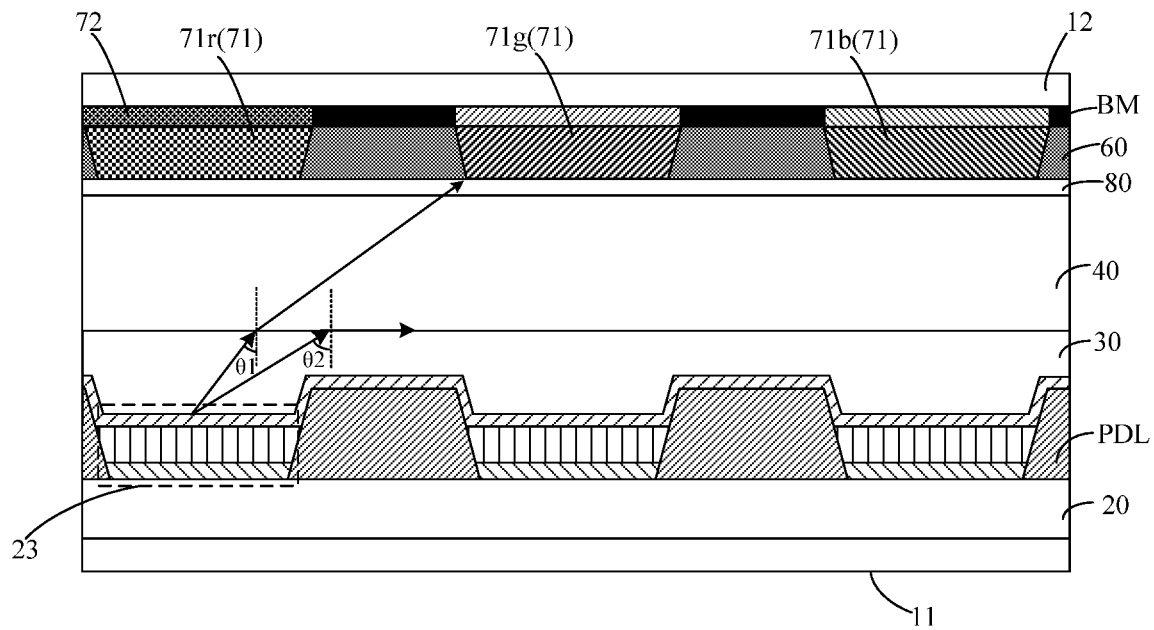
FIG. 1 is a schematic diagram of a display panel in the related art.

FIG. 1 is a schematic view of a display panel in the related art. As shown in FIG. 1, the display panel may be an assembled structure. Specifically, the display panel includes a display substrate and a counter substrate opposite to each other, and a filling layer 40 between the display substrate and the counter substrate. The display substrate includes a first base substrate 11; and a driving structure layer 20, a plurality of light emitting devices 23, and a first encapsulation layer 30 provided on the first base substrate 11. A driving current for each of the plurality of light emitting devices 23 is provided by the driving structure layer 20 for driving the light emitting device 23 to emit light. The light emitting device 23 is used for emitting light of a preset color, for example, blue light. The first encapsulation layer 30 covers the plurality of light emitting devices 23 for encapsulating the light emitting devices 23. The counter substrate includes a second base substrate 12; and a color filter layer, a black matrix BM, and a color conversion layer 71 provided on the second base substrate 12. The color conversion layer includes a plurality of light emergent portions 71 including, for example, a plurality of red light emergent portions 71r, a plurality of green light emergent portions 71g, and a plurality of blue light emergent portions 71b. Each of the plurality of light emergent portions 71 corresponds to one light emitting device 23, and different light emergent portions 71 correspond to different light emitting devices 23. A red light emergent portion 71r emits red light when being excited by light of the preset color, the green light emergent portion 71g emits green light when being excited by light of the preset color, and the blue light emergent portion 71b directly transmits the blue light. For example, a material of the red light emergent portion 71r and a material of the green light emergent portion 71g each include a quantum dot material. A material of the blue light emergent portion 71b may include a scattering particle material. The color filter layer includes a plurality of color filter portions 72 in a one-to-one correspondence with the light emergent portions 71. A color filter portion 72 has the same color as the color of a corresponding light emergent portion 71. In addition, the counter substrate may further include a third encapsulating layer 80 on a side of the color conversion layer away from the second base substrate 12 for encapsulating the color conversion layer.

Figure 2:
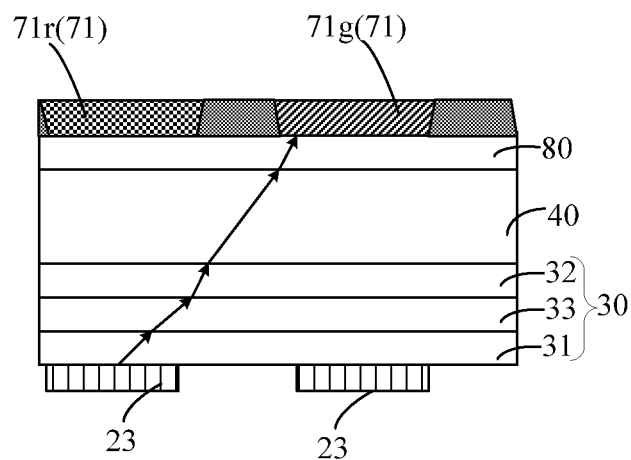
FIG. 2 is a schematic diagram illustrating how light emitted from a light emitting device in FIG. 1 is reflected by respective layers of the display panel.

FIG. 2 is a schematic diagram illustrating how light emitted from a light emitting device in FIG. 1 is reflected by the respective layers of the display panel. As shown in FIG. 2, the first encapsulation layer 30 may include a plurality of encapsulation sub-layers. For example, the plurality of encapsulation sub-layers include a first inorganic encapsulation sub-layer 31, an organic encapsulation sub-layer 33, and a second inorganic encapsulation sub-layer 32 sequentially provided in a direction away from the first base substrate 11. In one example, a refractive index of each of the first and second inorganic encapsulation sub-layers 31 and 32 is greater than a refractive index of the organic encapsulation sub-layer 33, the refractive index of the organic encapsulation sub-layer 33 is substantially the same as a refractive index of the filling layer 40, and a refractive index of the third encapsulation layer 80 is substantially the same as the refractive index of the first inorganic encapsulation sub-layer 31. When the display panel is displaying, not all light rays emitted from the light emitting device 23 are collimated, and a part of the light rays with a large angle may be generated, and these light rays with a large angle are refracted by the layers between the color conversion layer and the light emitting device 23 and then irradiated onto the color conversion layer. Since the organic encapsulation sub-layer 33 and the filling layer 40 each have a low refractive index, light rays gradually diverge as they pass through the two layers, so that some light rays emitted from the light emitting device 23 may be irradiated onto a light emergent portion corresponding to an adjacent light emitting device 23. For example, in FIG. 2, a part of light rays emitted from the light emitting device 23 corresponding to the red light emergent portion 71r are irradiated onto the green light emergent portion 71g, thereby exciting the green light emergent portion 71g to emit light and causing the crosstalk between the sub-pixels.

Figure 3:
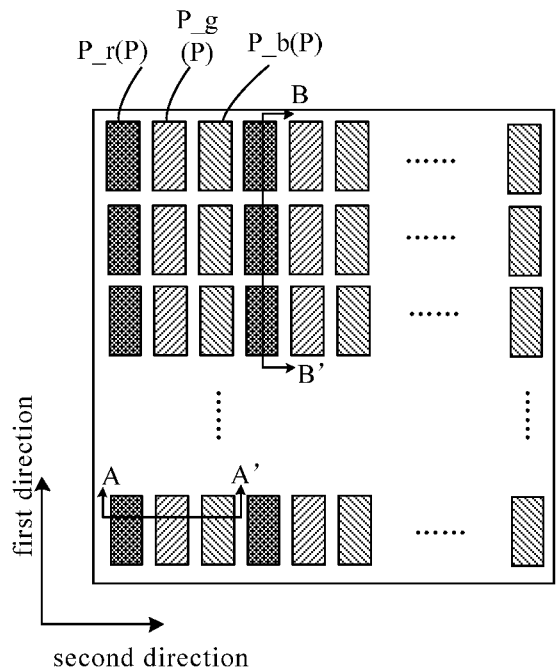
FIG. 3 is a plan view of a display panel in some embodiments of the present disclosure.
Figure 4A:
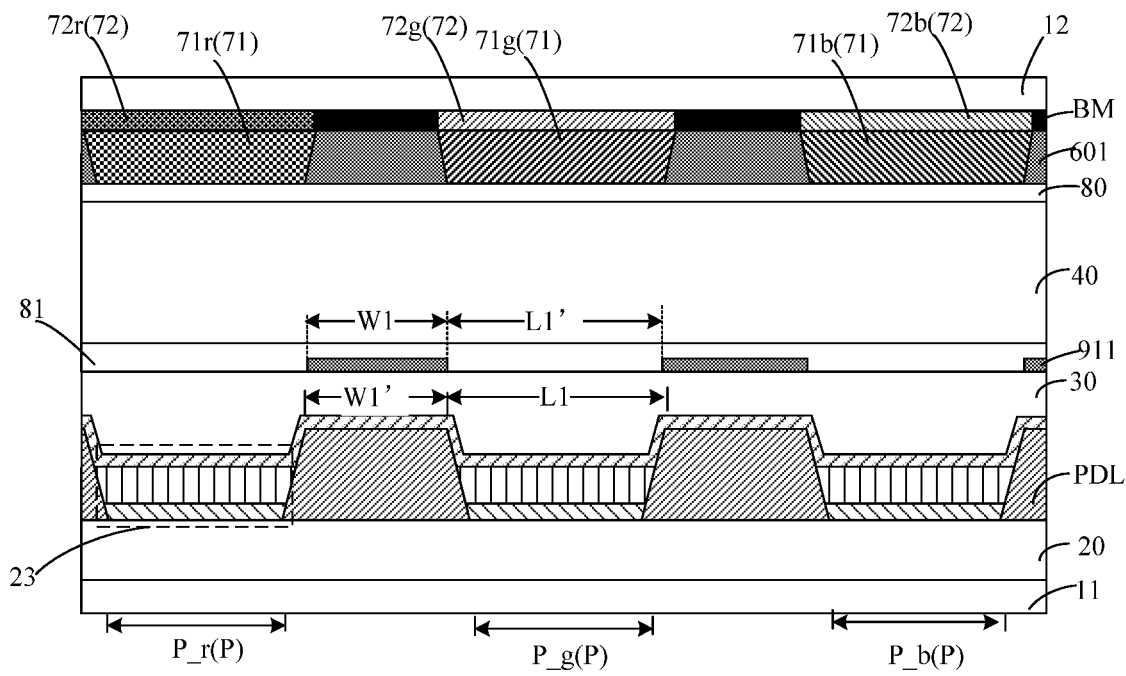
FIG. 4A is a cross-sectional view taken along a line A-A' in FIG. 3 in some embodiments of the present disclosure.
Figure 4B:
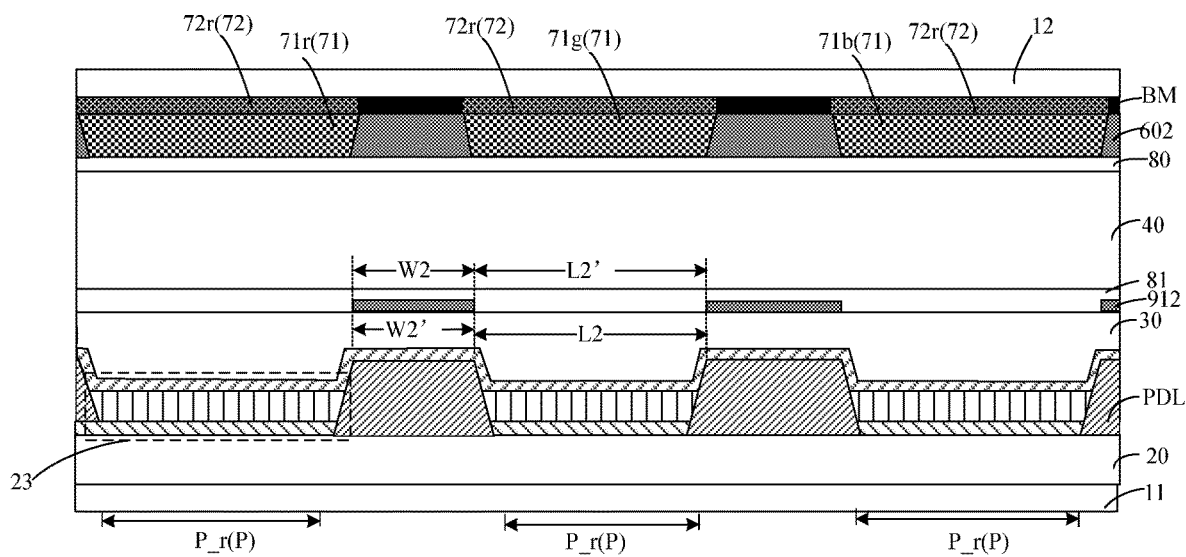
FIG. 4B is a cross-sectional view taken along a line B-B' in FIG. 3 in some embodiments of the present disclosure.
Figure 4C:
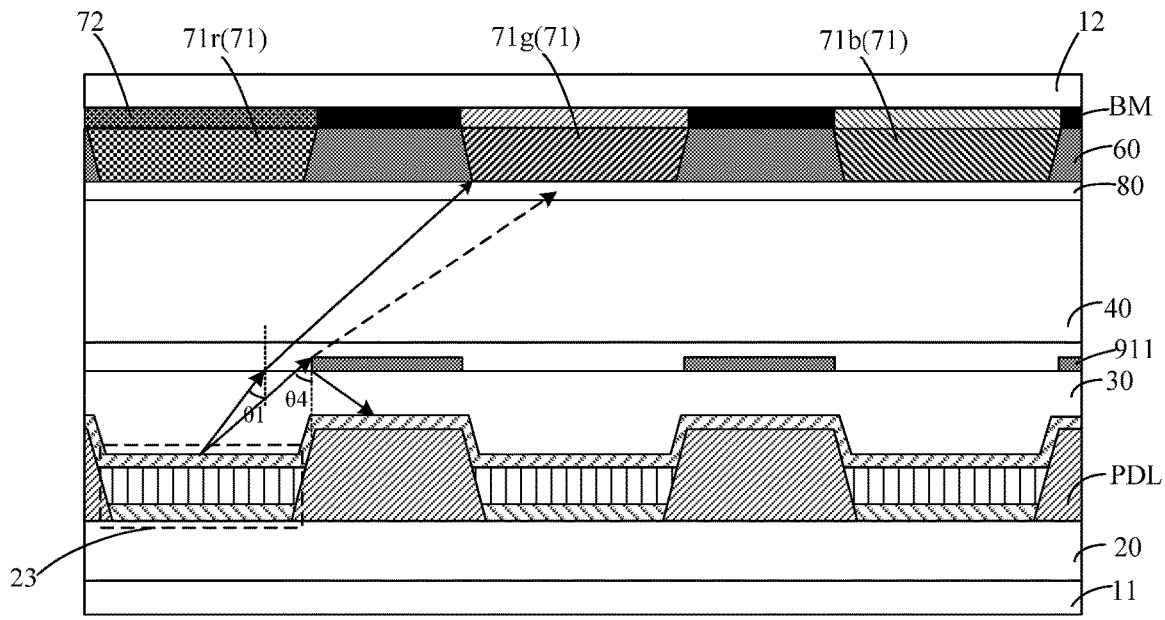
FIG. 4C is a diagram illustrating emergent light rays emitted from the light emitting device of the display panel in FIG. 4A.

FIG. 3 is a plan view of a display panel in some embodiments of the present disclosure, FIG. 4A is a cross-sectional view taken along a line A-A' in FIG. 3 in some embodiments of the present disclosure, FIG. 4B is a cross-sectional view taken along a line B-B' in FIG. 3 in some embodiments of the present disclosure, and FIG. 4C is a diagram illustrating emergent light rays emitted from the light emitting device of the display panel in FIG. 4A. As shown in FIG. 3, the display panel is divided into a plurality of sub-pixels P, for example, the plurality of sub-pixels P are arranged in an array and may constitute a plurality of repeating units. Each of the repeating units includes: a red sub-pixel P_r, a green sub-pixel P_g and a blue sub-pixel P_b arranged in a first direction. It should be noted that, the sub-pixels P in FIG. 3 is only an example, and the sub-pixels P may alternatively be arranged in any other manner. As shown in FIGS. 3 to 4B, the display panel includes a first base substrate 11, a pixel definition layer PDL, and a plurality of light emitting devices 23.

The first base substrate 11 may be a glass base substrate, or may be a flexible base substrate made of a flexible material, such as polyimide (PI), to facilitate a flexible display.

Figure 5:
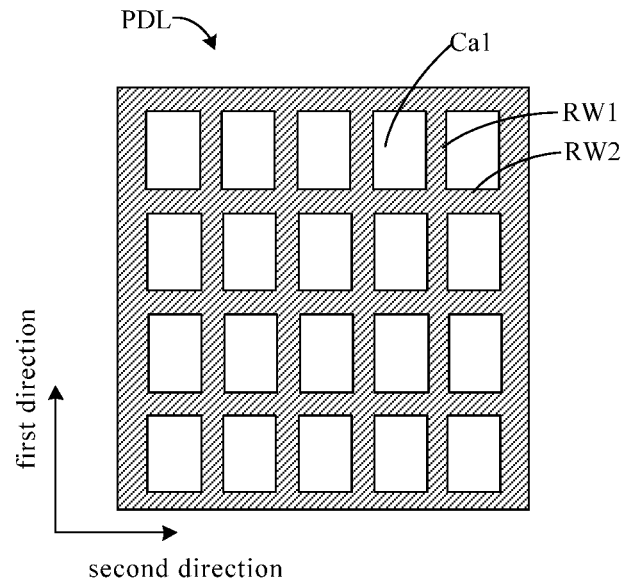
FIG. 5 is a plan view of a pixel definition layer in some embodiments of the present disclosure.

The pixel definition layer PDL is provided on the first base substrate 11. FIG. 5 is a plan view of a pixel definition layer in some embodiments of the present disclosure. As shown in FIG. 5, the pixel definition layer PDL includes a plurality of barriers. For example, the plurality of barriers include a plurality of first barriers RW1 extending in the first direction and a plurality of second barriers RW2 extending in the second direction. The plurality of first barriers RW1 are arranged in the second direction, and the plurality of second barriers RW2 are arranged in the first direction. The plurality of first barriers RW1 intersect with the plurality of second barriers RW2 to define a plurality of first accommodating portions Ca1. Each of the sub-pixels P is provided with one first accommodating portion Ca1. THE first barrier RW1 has a first top surface away from the first base substrate 11, and THE second barrier RW2 has a second top surface away from the first base substrate 11. In FIGS. 4A to 4C, the first top surface is an upper surface of the first barrier RW1, and the second top surface is an upper surface of the second barrier RW2.

The light emitting devices 23 are provided in the first accommodating portions Ca1 in a one-to-one correspondence. That is, one first accommodating portion Ca1 corresponds to one light emitting device 23, different first accommodating portions Ca1 correspond to different light emitting devices 23, and each of the light emitting devices 23 is provided in a corresponding first accommodating portion Ca1. A driving structure layer 20 may be provided on the first base substrate 11, and is used for providing a driving signal to each of the light emitting devices 23 to drive the light emitting device 23 to emit light.

The first encapsulation layer 30 covers the pixel definition layer PDL and the light emitting devices 23 for encapsulating the light emitting devices 23.

The color conversion layer is provided on a side of the first encapsulation layer 30 away from the first base substrate 11, and includes a plurality of light emergent portions 71. One light emergent portion 71 corresponds to one light emitting device 23, and different light emergent portions 71 correspond to different light emitting devices 23. Each of the light emergent portions 71 is configured to receive light of a preset color and emit light with a color the same as or different from the preset color. For example, the preset color is blue, and the color of the light emitted from the light emergent portion 71 may be red, green or blue. Each of the sub-pixels P is provided with one light emitting device 23 and one light emergent portion 71, and the color emitted from the light emergent portion 71 is the color of the sub-pixel P.

Figure 6:
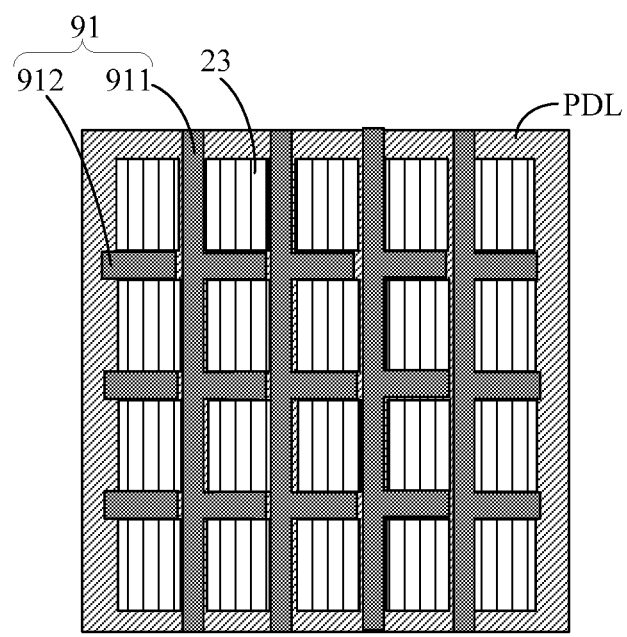
FIG. 6 is a schematic view illustrating a position relationship between a first light shielding pattern and a pixel definition layer in some embodiments of the present disclosure.

A first light shielding pattern is provided between the first encapsulation layer 30 and the color conversion layer. FIG. 6 is a schematic diagram illustrating a position relationship between the first light shielding pattern and the pixel definition layer. As shown in FIG. 6, an orthographic projection of the first light shielding pattern 91 on the first base substrate 11 overlaps with an orthographic projection of the barriers on the first base substrate 11, and an orthographic projection of at least a part of the light emitting device 23 on the first base substrate 11 does not overlap with the orthographic projection of the first light shielding pattern 91 on the first base substrate 11. For example, the first light shielding pattern may include: a plurality of first light shielding strips 911 extending in the first direction and a plurality of second light shielding strips 912 extending in the second direction. An orthographic projection of the first light shielding strips 911 on the first base substrate 11 overlaps with an orthographic projection of the first barriers RW1 on the first base substrate 11, and an orthographic projection of the second light shielding strips 912 on the first base substrate 11 overlaps with an orthographic projection of the second barriers RW2 on the first base substrate 11.

As shown in FIG. 4C, without the first light shielding pattern 91, the light rays emitted from the light emitting device 23 may be irradiated on the light emergent portion 71 of an adjacent sub-pixel P (as shown by a dotted arrow in FIG. 4C). With the first light shielding pattern 91 provided between the first encapsulation layer 30 and the color conversion layer in the embodiment of the present disclosure, the light rays originally irradiated onto the adjacent sub-pixel P may be blocked or shielded by the first light shielding pattern 91, thereby reducing the crosstalk between two adjacent sub-pixels P.

In some embodiments, the second barrier RW2 between any two adjacent light emitting devices 23 arranged in the first direction corresponds to at least one second light shielding strip 912, thereby reducing the crosstalk between the two adjacent sub-pixels arranged in the first direction. And/or, the first barrier RW1 between any two adjacent light emitting devices 23 arranged in the second direction corresponds to at least one first light shielding strip 911, thereby reducing the crosstalk between the two adjacent sub-pixels arranged in the second direction.

In some embodiments, a width of the first light shielding strip 911 is greater than or equal to a width of the first top surface of a corresponding first barrier RW1 to minimize the crosstalk between two adjacent sub-pixels arranged in the second direction. A width of the second light shielding strip 912 is greater than or equal to a width of the second top surface of a corresponding second barrier RW2 to minimize the crosstalk between two adjacent sub-pixels arranged in the first direction.

It should be understood that, in the embodiments of the present disclosure, a width of a certain structure refers to a size of the certain structure in a direction perpendicular to an extending direction of the certain structure. The width of the first top surface refers to a size of the first top surface in a direction perpendicular to an extending direction of the first barrier RW1; and the width of the second top surface refers to a size of the second top surface in a direction perpendicular to an extending direction of the second barrier RW2.

The display panel in the embodiments of the present disclosure will be described below with reference to the accompanying drawings.

In some embodiments, as shown in FIGS. 4A and 4B, the driving structure layer 20 is provided on the first base substrate 11, and the driving structure layer 20 includes a plurality of pixel driving circuits. The pixel driving circuits are in one-to-one correspondence with the light emitting devices 23, and a pixel driving circuit is configured to provide a driving current for the light emitting device 23 to drive the light emitting device 23 to emit light. For example, the pixel driving circuit includes a plurality of thin film transistors 21.

Figure 7:
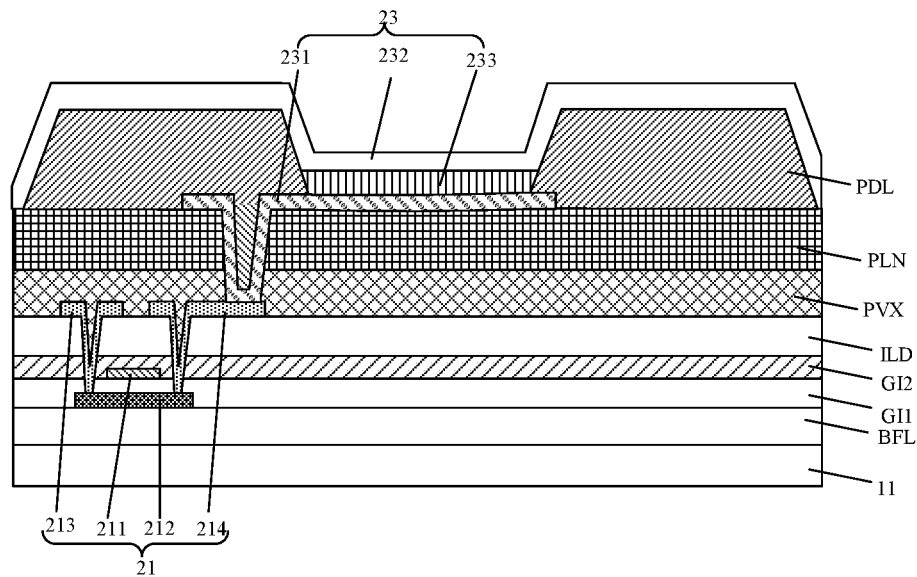
FIG. 7 is a schematic diagram illustrating a connection relationship between a driving structure layer and a light emitting device in some embodiments of the present disclosure.

FIG. 7 is a schematic diagram illustrating a connection relationship between a driving structure layer and a light emitting device in some embodiments of the present disclosure. As shown in FIG. 7, the thin film transistor 21 includes a gate electrode 211, an active layer 212, a source electrode 213, and a drain electrode 214. Taking a top gate thin film transistor as an example of the thin film transistor 21, the active layer 212 is located between the gate electrode 211 and the first base substrate 11. A material of the active layer 212 may include, for example, an inorganic semiconductor material (e.g., polysilicon, amorphous silicon, etc.), an organic semiconductor material, or an oxide semiconductor material. The active layer 212 includes a channel portion, and a source connection portion and a drain connection portion at two sides of the channel portion, respectively. The source connection portion is connected to the source electrode 213 of the thin film transistor 21, and the drain connection portion is connected to the drain electrode 214 of the thin film transistor 21. Each of the source connection portion and the drain connection portion may be doped with an impurity (e.g., an N-type impurity or a P-type impurity) having a higher impurity concentration than that of the channel portion. The channel portion is directly opposite to the gate electrode 211 of the thin film transistor 21, and when a voltage signal applied to the gate electrode 211 reaches a preset value, a carrier path is formed in the channel portion, and a current flows from the source electrode 213 to the drain electrode 214, and the thin film transistor 21 is turned on.

A buffer layer BFL is provided between the thin film transistor 21 and the first base substrate 11, and serves to prevent or reduce diffusion of metal atoms and/or impurities from the first base substrate 11 into the active layer 212 of the thin film transistor. The buffer layer BFL may include an inorganic material, such as silicon oxide, silicon nitride, and/or silicon oxynitride, and may be formed as a multilayer or a single layer.

A first gate insulating layer GI1 is provided on a side of the active layer 212 away from the first base substrate 11. A material of the first gate insulating layer GI1 may include a silicon compound or a metal oxide. For example, the material of the first gate insulating layer GI1 includes silicon oxynitride, silicon oxide, silicon nitride, silicon oxycarbide, silicon carbonitride, aluminum oxide, aluminum nitride, tantalum oxide, hafnium oxide, zirconium oxide, titanium oxide, and the like. In addition, the first gate insulating layer GI1 may be a single layer or a multilayer.

A gate electrode layer is provided on a side of the first gate insulating layer GI1 away from the first base substrate 11. The gate electrode layer includes a gate electrode 211 of a respective thin film transistor and a first electrode plate of a capacitor. A material of the gate electrode layer may include, for example, a metal, a metal alloy, a metal nitride, a conductive metal oxide, a transparent conductive material, or the like. For example, the gate electrode layer may include gold, an gold alloy, silver, an silver alloy, aluminum, an aluminum alloy, aluminum nitride, tungsten, tungsten nitride, copper, an copper alloy, nickel, chromium, chromium nitride, molybdenum, an molybdenum alloy, titanium, titanium nitride, platinum, tantalum, tantalum nitride, neodymium, scandium, strontium ruthenium oxide, zinc oxide, tin oxide, indium oxide, gallium oxide, indium tin oxide, indium zinc oxide, or the like. The gate electrode layer may be a single layer or a multilayer.

A second gate insulating layer GI2 is provided on a side of the gate electrode layer away from the first base substrate 11, and a material of the second gate insulating layer GI2 may include, for example, a silicon compound or a metal oxide. For example, the material of the second gate insulating layer GI2 may include silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. The second gate insulating layer GI2 may be a single layer or a multilayer.

A second electrode plate of the capacitor (not shown) is provided on a side of the second gate insulating layer GI2 away from the first base substrate 11, and a material of the second electrode plate may be the same as that of the first electrode plate, specifically referring to the conductive material above.

An interlayer insulating layer ILD is provided on a side of the second electrode plate of the capacitor away from the first base substrate 11, and a material of the interlayer insulating layer ILD may include, for example, a silicon compound, a metal oxide, or the like. In particular, the silicon compound and metal oxide above may be selected, which will not be described in detail here.

A source-drain conductive layer is provided on a side of the interlayer insulating layer ILD away from the first base substrate 11. The source-drain conductive layer may include a source electrode 213 and a drain electrode 214 of a respective transistor, the source electrode 213 is electrically connected to the source connection portion, and the drain electrode 214 is electrically connected to the drain connection portion. The source-drain conductive layer may include a metal, an alloy, a metal nitride, a conductive metal oxide, a transparent conductive material, or the like. For example, the source-drain conductive layer may be a single layer or a multilayer of metals, such as Mo/Al/Mo or Ti/Al/Ti.

A passivation layer PVX is provided on a side of the source-drain conductive layer away from the first base substrate 11, and a material of the passivation layer PVX may include, for example, silicon oxynitride, silicon oxide, silicon nitride, or the like. A planarization layer PLN is provided on a side of the passivation layer PVX away from the first base substrate 11, and the planarization layer PLN may be made of an organic insulating material, for example, a resin-based material such as polyimide, epoxy resin, acrylic, polyester, photoresist, polyacrylate, polyamide, or siloxane.

A pixel definition layer PDL is provided on a side of the planarization layer PLN away from the first base substrate 11, and the pixel definition layer PDL includes a plurality of barriers, for example, the plurality of barriers include a plurality of first barriers RW1 arranged in the second direction and a plurality of second barriers RW2 arranged in the first direction. Each of the plurality of first barriers RW1 extends in the first direction, each of the plurality of second barriers s RW2 extends in the second direction, and the first direction intersects with the second direction, for example, the first direction and the second direction are perpendicular to each other. The plurality of first barriers RW1 intersect with the plurality of second barriers RW2 to define a plurality of first accommodating portions Ca1. The light emitting devices 23 are provided in one-to-one correspondence with the first accommodating portions Ca1. Each of the light emitting devices 23 includes: a first electrode 231, a second electrode 232, and a light emitting function layer 233 between the first electrode 231 and the second electrode 232. For example, the first electrode 231 is an anode and the second electrode 232 is a cathode. Optionally, the first electrode 231 is a reflective electrode made of a metal material, and the second electrode 232 is a transparent electrode made of a transparent conductive material (e.g., indium tin oxide). The light emitting function layer 233 may include: a hole injection layer, a hole transport layer, a light emitting layer, an electron transport layer, and an electron injection layer, which are sequentially stacked together. The first electrode 231 is located between the pixel definition layer PDL and the planarization layer PLN, and a part of the first electrode 231 is exposed from the first accommodating portion Ca1. Second electrodes 232 of the plurality of light emitting devices 23 may be formed in a one-piece structure.

Optionally, the light emitting device 23 is an OLED device, and in this case, the light emitting layer includes an organic light emitting material. Alternatively, the light emitting device 23 is a QLED (quantum dot Light emitting diode) device, and in this case, a quantum dot light emitting material is used for the light emitting layer. Each of the light emitting devices 23 is configured to emit light of a preset color.

As shown in FIGS. 4A and 4B, the display panel further includes a first encapsulation layer 30, and the first encapsulation layer 30 covers the pixel definition layer PDL and the plurality of light emitting devices 23 for encapsulating the light emitting devices 23, to prevent the light emitting devices 2 from being corroded by moisture and/or oxygen in the external environment. In some embodiments, the first encapsulation layer 30 includes a plurality of encapsulation sub-layers stacked together. For example, the plurality of encapsulation sub-layers include: a first inorganic encapsulation sub-layer 31, a second inorganic encapsulation sub-layer 32 and an organic encapsulation sub-layer 33. The second inorganic encapsulation sub-layer 32 is located on a side of the first inorganic encapsulation sub-layer 31 away from the first base substrate 11, and the organic encapsulation sub-layer 33 is located between the first inorganic encapsulation sub-layer 31 and the second inorganic encapsulation sub-layer 32. The first inorganic encapsulation sub-layer 31 and the second inorganic encapsulation sub-layer 32 each may be made of a high density inorganic material, such as silicon oxynitride, silicon oxide, or silicon nitride. The organic encapsulation sub-layer 33 may be made of a polymer material containing a desiccant or a polymer material that blocks moisture. For example, a polymer resin is used for the organic encapsulation sub-layer 33, so that the stress of the first inorganic encapsulation sub-layer 31 and the second inorganic encapsulation sub-layer 32 can be relieved, and a water-absorbing material such as a desiccant may be included to absorb water molecules and/or oxygen molecules intruding into the first encapsulation layer 30.

As shown in FIGS. 4A, 4B and 6, the first light shielding pattern is located on a side of the first encapsulation layer 30 away from the first base substrate 11. The first light shielding pattern 91 includes: a plurality of first light shielding strips 911 and a plurality of second light shielding strips 912. Each of the first light shielding strips 911 extends in the first direction, and each of the second light shielding strips 912 extends in the second direction. An orthographic projection of each of the first light shielding strips 911 on the first base substrate 11 overlaps with an orthographic projection of a corresponding first barrier RW1 on the first base substrate 11, and an orthographic projection of each of the second light shielding strips 912 on the first base substrate 11 overlaps with an orthographic projection of a corresponding second barrier RW2 on the first base substrate 11.

A second barrier RW2 between any two adjacent light emitting devices 23 arranged in the first direction corresponds to at least one second light shielding strip 912, thereby reducing the crosstalk between the two adjacent sub-pixels arranged in the first direction. Similarly, a first barrier RW1 between any two adjacent light emitting devices 23 arranged in the second direction corresponds to at least one first light shielding strip 911, thereby reducing the crosstalk between the two adjacent sub-pixels arranged in the second direction.

In some embodiments, the first accommodating portion Ca1 has a first opening on a side away from the first base substrate 11. The first opening has a size L1 in the second direction and a size L2 in the first direction. The first light shielding strip 911 has a width of W1, and the second light shielding strip 912 has a width of W2; the first top surface of the first barrier RW1 has a width of W1', and the second top surface of the second barrier RW2 has a width of W2'. A distance between any two adjacent first light shielding strips 911 arranged in the second direction is L1', and a distance between any two adjacent second light shielding strips 912 arranged in the first direction is L2'. Optionally, W1'≤W1≤W1'+L1*0.4, W2'≤W2≤W2'+L2*0.4. Then, when a center line of the first light shielding strip 911 in its width direction is aligned with a center line of a corresponding first barrier RW1 in its width direction, and a center line of the second light shielding strip 912 in its width direction is aligned with a center line of a corresponding second barrier RW2 in its width direction, W1'≥W1, W2≥W2'; and L1'≥0.8*L1, L2'≥0.8*L2, so that the crosstalk between two adjacent sub-pixels P can be reduced as much as possible, and the influence of the first light shielding pattern 91 on the brightness of the display panel can be reduced.

In some embodiments, each of the first light shielding strips 911 and the second light shielding strips 912 has a thickness of 0.5 μm to 1 μm.

In some embodiments, the first light shielding strip 911 and the second light shielding strip 912 each may be made of a reflective material, for example, a metal material such as Au, Ag, Al, and Cu. Alternatively, the first light shielding strip 911 and the second light shielding strip 912 each may be made of a light absorbing material, for example, a metal material such as Mo. A material of the first light shielding strip 911 may be the same as that of the second light shielding strip 912.

Continuing to refer to FIGS. 4A and 4B, the display panel further includes a second encapsulation layer 81 covering the first light shielding pattern, to prevent the first light shielding strips 911 and the second light shielding strips 912 from being corroded by moisture and/or oxygen in the external environment.

The second encapsulation layer 81 may have a thickness of 0.5 μm to 1 μm, so that the whole display panel is ensured to have a small thickness while the protection effect is achieved.

The second encapsulation layer 81 may have the same refractive index as that of the encapsulation sub-layer (i.e., the second inorganic encapsulation sub-layer 32) of the first encapsulation layer 30 farthest from the first base substrate 11, thereby preventing the second encapsulation layer 81 from affecting light emitted from the light emitting device 23. For example, each of the second encapsulation layer 81 and the second inorganic encapsulation sub-layer 32 may be made of any one of silicon nitride, silicon oxide, or silicon oxynitride.

Figure 8:
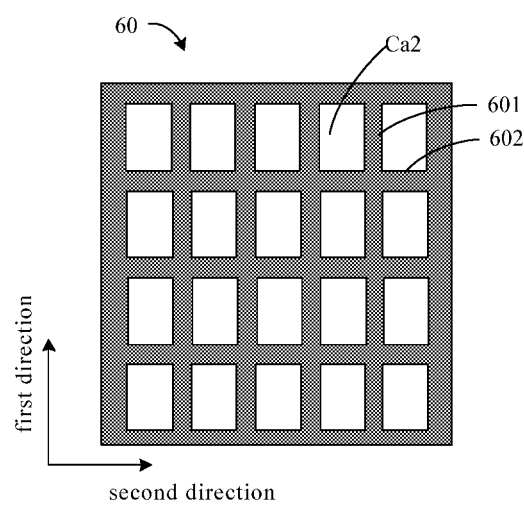
FIG. 8 is a plan view of an accommodating structure layer in some embodiments of the present disclosure.

Continuing to refer to FIGS. 4A and 4B, the display panel further includes: a second base substrate 12, and a color conversion layer and an accommodating structure layer provided on the second base substrate 12. FIG. 8 is a plan view of an accommodating structure layer in some embodiments of the present disclosure. As shown in FIGS. 4A, 4B and 8, a second base substrate 12 is provided opposite to the first base substrate 11, and the second base substrate 12 may be a glass base substrate or a flexible base substrate made of a flexible material, such as polyimide (PI), to facilitate a flexible display. The color conversion layer and the accommodating structure layer 60 are provided on a side of the second base substrate 12 facing the first base substrate 11, and the color conversion layer includes a plurality of light emergent portions 71. The plurality of light emergent portions 71 include: for example, a red light emergent portion 71r, a green light emergent portion 71g, and a blue light emergent portion 71b. The red light emergent portion 71r is excited by the blue light emitted from the light emitting device 23 to emit red light, the green light emergent portion 71g is excited by the blue light emitted from the light emitting device 23 to emit green light, and the blue light emitted from the light emitting device 23 passes through the blue light emergent portion 71b.

For example, a material of the red light emergent portion 71r may include a red quantum dot material, a material of the green light emergent portion 71g may include a green quantum dot material, and a material of the blue light emergent portion 71b may include a scattering particle material. The red quantum dot material is used for emitting red light when being excited by the blue light emitted from the light emitting device 23; the green quantum dot material is used for emitting green light when being excited by the blue light emitted from the light emitting device 23. The red quantum dot material and the green quantum dot material may be at least one of indium phosphide (InP), zinc oxide (ZnO), graphene, cadmium selenide (CdSe), cadmium sulfide (CdS), cadmium telluride (CdTe), zinc selenide (ZnSe), zinc telluride (ZnTe) or zinc sulfide (ZnS). The color of the light emitted by the quantum dot material may be controlled by controlling the particle size of the quantum dot material. For example, in a case where a material of both the red quantum dot material and the green quantum dot material is zinc sulfide, the particle size of the red quantum dot material is in a range from 9 nm to 10 nm, so that the red light is emitted; and the particle size of the green quantum dot material is in a range from 6.5 to 7.5 nm, so that the green light is emitted. A material of the blue light emergent portion 71b includes a scattering particle material, thereby scattering the received blue light.

In addition, the red light emergent portion 71r and the green light emergent portion 71g may be doped with scattering particles, so that the respective light emergent portion 71 may emit light having a large light exit angle due to scattering of the scattering particles even if the light exit angle of the light emitting device 23 is small.

The accommodating structure layer includes: a plurality of first dams 601 arranged in the second direction and a plurality of second dams 602 arranged in the first direction. Each of the first dams 601 extends in the first direction, and each of the second dams 602 extends in the second direction. The plurality of first dams 601 intersect with the plurality of second dams 602 to define a plurality of second accommodating portions Ca2. Each of the first dams 601 has a first bottom surface facing the first base substrate 11, and each of the second dams 602 has a second bottom surface facing the first base substrate 11. In FIGS. 4A to 4C, the first bottom surface is a lower surface of a first dam 601, and the second bottom surface is a lower surface of a second dam 602.

One light emergent portion 71 is provided in each of the second accommodating portions Ca2, and different light emergent portions 71 are provided in different second accommodating portions Ca2. Each of the second accommodating portions Ca2 has a second opening facing the first base substrate 11, and the light emitted from the light emitting device 23 enters the light emergent portion 71 from the second opening. Optionally, a cross-sectional area of the second accommodating portion Ca2 gradually decreases in a direction away from the second base substrate 12. A material of the accommodating structure layer 60 may include: an acrylic polymer photoinitiator, an organic pigment, a resin organic material or a mixture thereof. The organic pigment may have a color of black to enable the accommodating structure layer 60 to have a light shielding function for preventing the crosstalk between different light emergent portions 71 from occurring.

As shown in FIGS. 4A and 4B, the display panel further includes a third encapsulation layer 80. The third encapsulation layer 80 is provided on a side of the color conversion layer away from the second base substrate 12 for encapsulating the color conversion layer. A material of the third encapsulation layer 80 may be any one of silicon nitride, silicon oxide, or silicon oxynitride.

In addition, since the blue light exists in the external environment, when the blue light in the external environment enters the red light emergent portion 71r and the green emerging light 71g, the red light emergent portion 71r and the green light emergent portion 71g may be excited by the blue light to emit light, thereby affecting the display of the display panel. In order to prevent the display of the display panel from being affected by the external ambient light, in some embodiments, the display panel further includes a color filter layer and a black matrix BM. The color filter layer is located on a side of the color conversion layer away from the first base substrate 11, and includes a plurality of color filter portions 72 in one-to-one correspondence with the light emergent portions 71. A color filter portion 72 has the same color as the light emitted from a corresponding light emergent portion 71. For example, a color filter portion 72r has the same color as the light emitted from the red light emergent portion 71r, a color filter portion 72g has the same color as the light emitted from the green light emergent portion 71g, and a color filter portion 72b has the same color as the light emitted from the blue light emergent portion 71b. The black matrix BM is located between the accommodating structure layer 60 and the second base substrate 12, and is formed in a mesh structure to define a plurality of sub-pixels. An orthographic projection of at least a part of each of the light emergent portions 71 on the first base substrate 11 does not overlap with an orthographic projection of the black matrix BM on the first base substrate 11.

As shown in FIG. 4A and FIG. 4B, the display panel further includes a filling layer 40 on a side of the second encapsulation layer 81 away from the first base substrate 11, and the filling layer 40 may be an optical adhesive layer. In the manufacturing process of the display panel, the structures, such as the driving structure layer 20, the pixel definition layer PDL, the light emitting devices 23, the first encapsulation layer 30, the first light shielding pattern 91, the second encapsulation layer 81, and the like, may be formed on the first base substrate 11 to obtain a display substrate; the structures, such as the color filter layer, the accommodating structure layer 60, and the color conversion layer and the like, may be formed on the second base substrate 12 to obtain a counter substrate; and then the display substrate and the counter substrate are aligned with each other, and are fixed together through the filling layer 40.

In some embodiments, the refractive index of the filling layer 40 is less than the refractive index of the second encapsulation layer 81. The reason for this is that, in a case where the first light shielding pattern 91 is made of a reflective material, the light emitted from a certain light emitting device 23 is reflected by the first light shielding pattern 91 to an adjacent light emitting device 23 and further reflected by the first electrode or the second electrode of the adjacent light emitting device 23, thereby causing crosstalk between the two adjacent sub-pixels. In a case where the refractive index of the filling layer 40 is smaller than the refractive index of the second encapsulation layer 81, even if the light emitted by a certain light emitting device 23 is reflected to the adjacent light emitting device 23 by the first light shielding pattern 91 and is reflected by the first electrode or the second electrode of the adjacent light emitting device 23, the total reflection is easy to occur, and the reflected light will not be emitted out from the display panel when the reflected light irradiates the interface between the filling layer 40 and the second encapsulation layer 81, so that the crosstalk between two adjacent sub-pixels is avoided.

The display effect of the display panel in FIG. 1 and the display effect of the display panel in FIG. 4A are compared as below. In the display panel shown in FIGS. 1 and 4A, a size L1 of the first opening of the first accommodating portion Ca1 in the second direction is 20 μm; and a width of the first dam 601 in the accommodating structural layer is gradually increased along a direction approaching to the first base substrate 11, for example, a longitudinal section of the first dam 601 in the second direction is trapezoidal. In addition, an orthographic projection of the bottom surface of the first dam 601 on the first base substrate 11 substantially coincides with an orthographic projection of a corresponding first barrier RW1 of the pixel definition layer PDL on the first base substrate 11. The first encapsulation layer 30 includes a first inorganic encapsulation sub-layer 31, an organic encapsulation sub-layer 33, and a second inorganic encapsulation sub-layer 32. The first inorganic encapsulation sub-layer 31 is made of silicon oxynitride and has a refractive index of about 1.8; the organic encapsulation sub-layer 33 has a refractive index of about 1.5; and the second inorganic encapsulation sub-layer 32 is made of silicon nitride and has a refractive index of about 1.8. The refractive index of the filling layer 40 is about 1.5; and the third encapsulation layer 80 is made of silicon oxynitride and has a refractive index of about 1.8. The first encapsulation layer 30 has a total thickness of 10 μm. The filling layer 40 has a thickness of 10 μm, and the third encapsulation layer 80 has a thickness of 1 μm.

The interface between the second inorganic encapsulation sub-layer 32 and the filling layer 40 has a significant impact on the light path of the light emitted from the light emitting device 23. In order to simplify the description, in FIG. 1, the first encapsulation layer 30 is regarded as a whole, and has a refractive index of about 1.9; and the filling layer 40 and the third encapsulation layer 80 are regarded as a whole, which has a refractive index approximate to the refractive index of the filling layer 40 (i.e., 1.5). In this case, as shown in FIG. 1, when the light emitted from the center of the light emitting device 23 is incident on the filling layer 40 at an angle smaller than θ1, the refracted light is finally irradiated on the light emergent portion 71 directly facing the light emitting device 23, or irradiated on the accommodating structure layer to be absorbed by the accommodating structure layer. When the light emitted from the center of the light emitting device 23 is incident on the filling layer 40 at an angle θ1, the refracted light is finally irradiated on the edge of the accommodating structure layer close to the light emergent portion 71. When the light emitted from the center of the light emitting device 23 is incident on the filling layer 40 at an angle larger than θ1, the refracted light is finally irradiated on the light emergent portion 71 in an adjacent sub-pixel P, thereby causing crosstalk between the sub-pixels P. When the light emitted from the center of the light emitting device 23 is incident on the filling layer 40 at an angle greater than or equal to θ2, the total reflection may occur at an interface between the filling layer 40 and the first encapsulation layer 30. According to the parameters of the above layers, θ2 may be calculated as about 52°, that is, when the incident angle between the light emitted from the center of the light emitting device 23 and the filling layer 40 is between θ1° and 52°, the crosstalk between two adjacent sub-pixels P arranged in the second direction occurs.

In the display panel shown in FIGS. 4A and 4B, taking two sub-pixels P arranged in the second direction as an example, the width of the first light shielding strip 911 is the same as the width of the top surface of the first barrier RW1; the second encapsulation layer has a thickness of 1 µm; the refractive index of the second encapsulation layer 81, the filling layer 40, and the third encapsulation layer 80 as a whole is similar to the refractive index of the filling layer 40 (i.e., 1.5), and the parameters of the other layers are the same as those in FIG. 1. In this case, the same as in FIG. 1, when the light emitted from the center of the light emitting device 23 is irradiated onto the upper surface of the first encapsulation layer 30 at an angle larger than or equal to θ2, the total reflection occurs. As shown in FIG. 4A and FIG. 6, when light emitted from the center of the light emitting device 23 is irradiated onto the upper surface of the first encapsulation layer 30 at an angle θ4, the light is irradiated onto the edge of the first light shielding strip 911 close to the light emitting device 23. The angle θ4 may be calculated to be equal to about 45° from the parameters of the above layers. Therefore, for the plurality of sub-pixels P arranged in the second direction shown in FIG. 4A, crosstalk with respect to light rays at the incident angle in the range of 45° to 52° can be prevented.

Figure 9A:
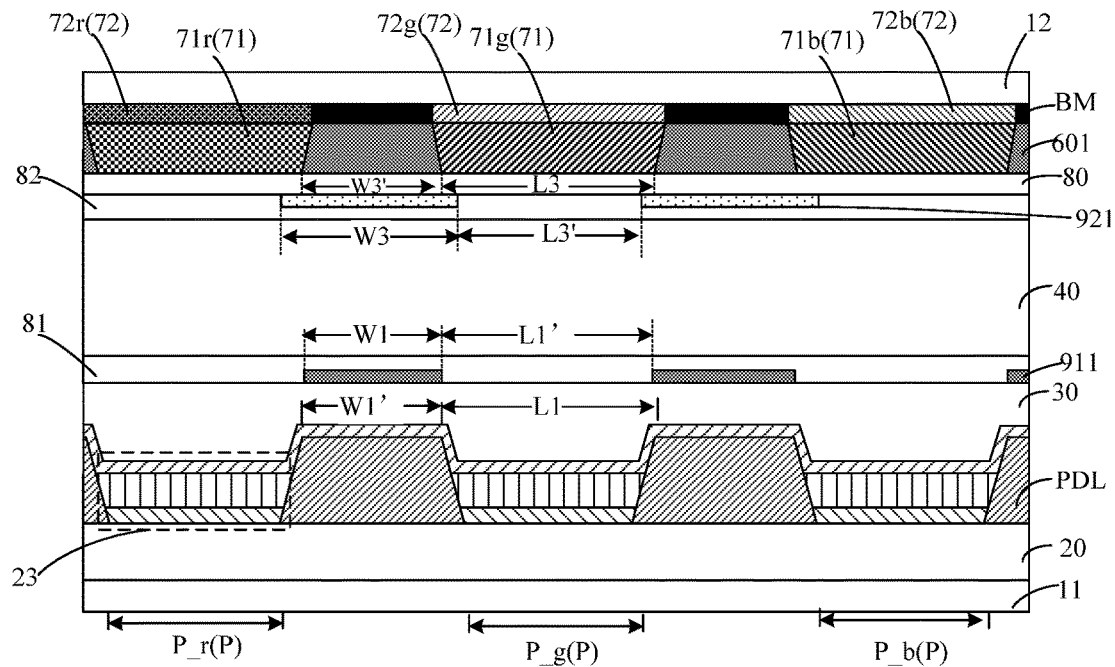
FIG. 9A is a cross-sectional view taken along a line A-A' in FIG. 3 in other embodiments of the present disclosure.
Figure 9B:
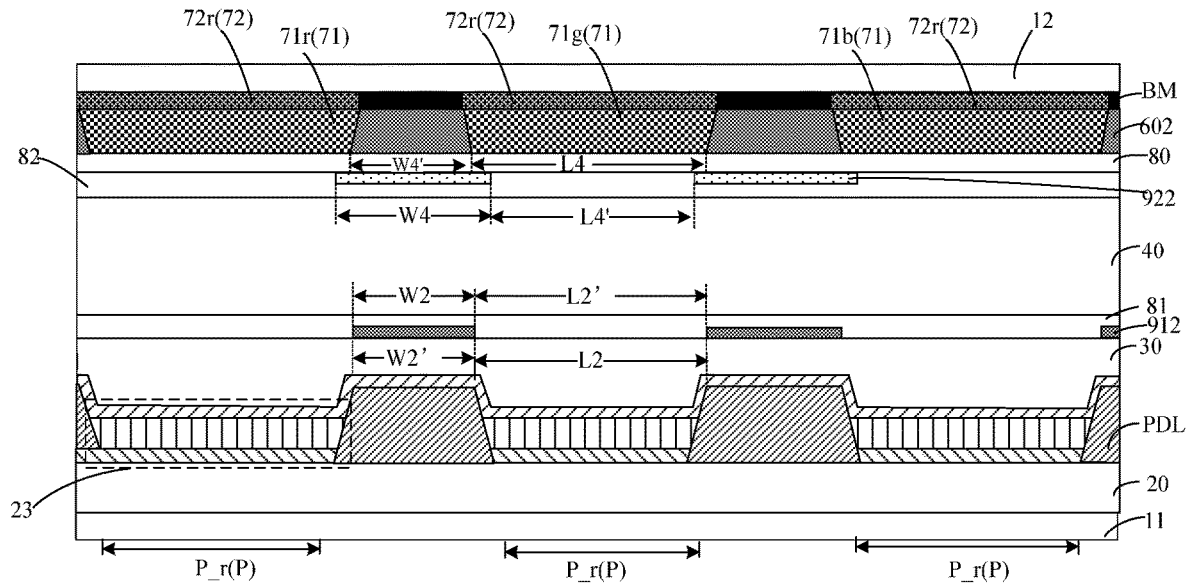
FIG. 9B is a cross-sectional view taken along a line B-B' in FIG. 3 in other embodiments of the present disclosure.
Figure 9C:
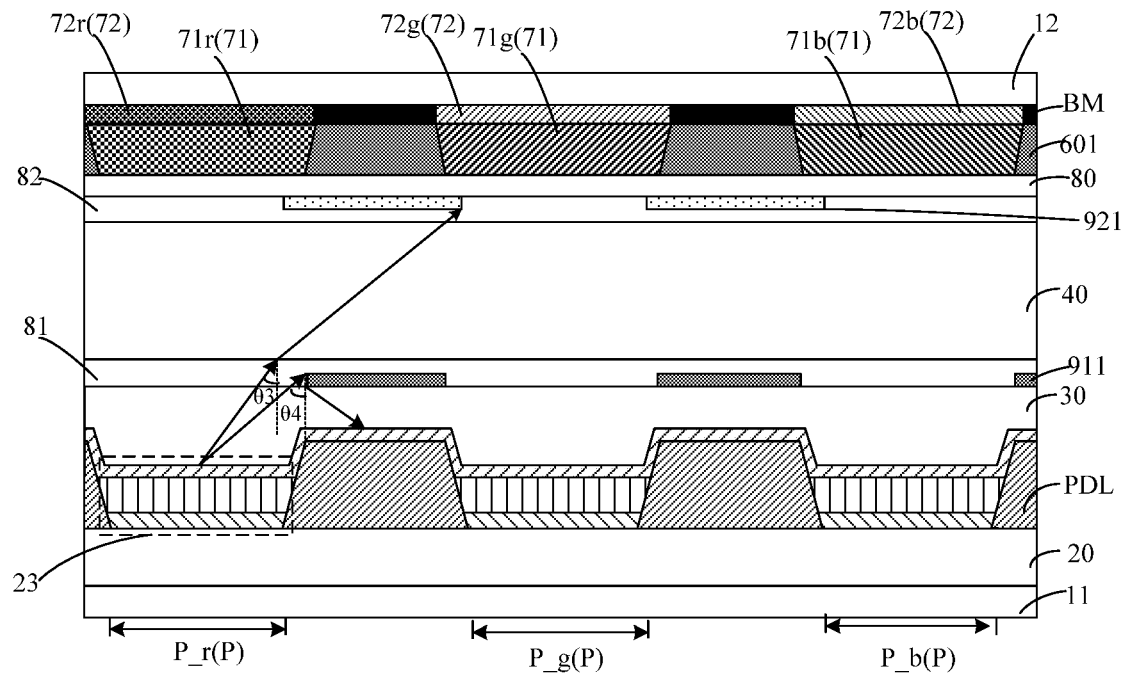
FIG. 9C is a diagram illustrating a light path of light emitted from a light emitting device of a display panel in FIG. 9A.
Figure 10:
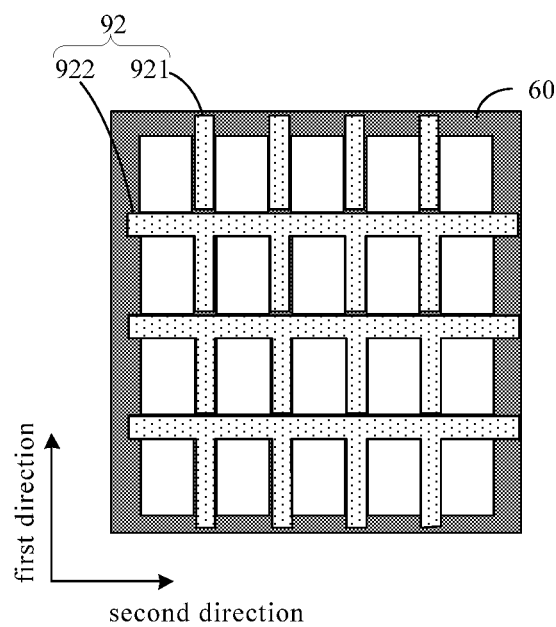
FIG. 10 is a schematic view illustrating a position relationship between a second light shielding pattern and an accommodating structure layer in other embodiments of the present disclosure.

FIG. 9A is a cross-sectional view taken along a line A-A' in FIG. 3 in other embodiments of the present disclosure, FIG. 9B is a cross-sectional view taken along a line B-B' in FIG. 3 in other embodiments of the present disclosure, and FIG. 9C is a diagram illustrating a light path of emerging light emitted from a light emitting device of a display panel in FIG. 9A. The display panel shown in FIGS. 9A to 9B is similar to the display panel shown in FIGS. 4A to 4B, except that the display panel in FIGS. 9A to 9B further includes: a second light shielding pattern and a fourth encapsulation layer 82. FIG. 10 is a schematic view illustrating position relationship between a second light shielding pattern and an accommodating structure layer in other embodiments of the present disclosure. As shown in FIGS. 9A to 10, the second light shielding pattern 92 is provided between the third encapsulation layer 80 and the filling layer 40, an orthographic projection of the second light shielding pattern 92 on the first base substrate 11 overlaps with an orthographic projection of the dams on the first base substrate 11, and at least a part of an orthographic projection of the light emitting device 23 on the first base substrate 11 does not overlap with the orthographic projection of the second light shielding pattern 92 on the first base substrate 11.

The second light shielding pattern 92 includes: a plurality of third light shielding strips 921 and a plurality of fourth light shielding strips 922. Each of the third light shielding strips 921 extends in the first direction, and each of the fourth light shielding strips 922 extends in the second direction.

As shown in FIGS. 8 to 10, the second dam 602 between any two adjacent light emergent portions 71 arranged in the first direction corresponds to at least one fourth light shielding strip 922; and/or the first dam 601 between any two adjacent light emerging portions 71 arranged in the second direction corresponds to at least one third light shielding strip 921.

Each of the third light shielding strips 921 and the fourth light shielding strips 922 may be made of a reflective material, for example, a metal such as Au, Ag, Al, and Cu. Alternatively, each of the third light shielding strips 921 and the fourth light shielding strips 922 may be made of a light absorbing material, for example, a metal such as Mo. The third light shielding strips 921 and the fourth light shielding strips 922 may be made of the same material, and a thickness of a third light shielding strip 921 and a thickness of a fourth light shielding strip 922 each may be in a range from 0.5 µm to 1 µm.

As shown in FIGS. 9A and 9B, the fourth encapsulation layer 82 covers all of the third light shielding strips 921 and all the fourth light shielding strips 922, so as to prevent the third light shielding strips 921 and the fourth light shielding strips 922 from being corroded by moisture and/or oxygen in the external environment.

A thickness of the fourth encapsulation layer 82 may be in a range from 0.5 µm to 1 µm, so that the whole display panel is ensured to have a small thickness while the protection effect is achieved. Optionally, a material of the fourth encapsulation layer 82 may include any one of silicon nitride, silicon oxide, or silicon oxynitride.

When a part of light rays emitted from the light emitting device 23 in a certain sub-pixel P are not shielded by the first light shielding strips 911 and are irradiated onto a sub-pixel adjacent to the certain sub-pixel in the second direction, at least a part of the part of light rays may be shielded by the third light shielding strip 921, thereby reducing the crosstalk between the two adjacent sub-pixels P arranged in the second direction. Similarly, when a part of light rays emitted from the light emitting device 23 in a certain sub-pixel are not shielded by the second light shielding strips 912 and are irradiated onto a sub-pixel P adjacent to the certain sub-pixel in the first direction, at least a part of the part of light rays may be shielded by the fourth light shielding strip 922, thereby reducing the crosstalk between the two adjacent sub-pixels P arranged in the first direction.

A width of the third light shielding strip 921 is W3, a width of the fourth light shielding strip 922 is W4, a width of an end surface (i.e., a first bottom surface) of the first dam 601 facing the first base substrate 11 is W3', a width of an end surface (i.e., a second bottom surface) of the second dam 602 facing the first base substrate 11 is W4', a size of the second opening of the second accommodating portion Ca2 in the second direction is L3, and a size of the second opening in the first direction is L4. A distance between any two adjacent third light shielding strips 921 arranged in the second direction is L3', and a distance between any two adjacent fourth light shielding strips 922 arranged in the first direction is L4'. W3 may be greater than W3' or less than or equal to W3'; W4 may be greater than W4' or less than or equal to W4'. In some embodiments, W3'≤W3≤W3'+0.4*L3, W4'≤W4≤W4'+0.4*L4. Then, in a case where a center line of the third light shielding strip 921 in its width direction is aligned with a center line of the first dam 601 in its width direction and a center line of the fourth light shielding strip 922 in its width direction is aligned with a center line of the second dam 602 in its width direction, 0.8*L3≤L3'≤L3, 0.8*L4≤L4'≤L4, and the light emitted from the light emitting device 23 is prevented from entering the light emergent portion 71 in an adjacent sub-pixel as much as possible while ensuring that the overall emerging light brightness of the sub-pixel is not affected.

The display effect of the display panel in FIG. 1 and the display effect of the display panel in FIGS. 9A to 9B are compared as below. The parameters of the layers in FIG. 1 are as described above. In FIGS. 9A to 9B, in a case where the width W3 of the third light shielding strip 921 is greater than the width W3' of the end surface of the first dam 601 facing the first base substrate 11, the distance L3' between two adjacent third light shielding strips 921 arranged in the second direction is greater than or equal to 0.8 times of the size L3 of the second opening in the second direction, the width W4 of the fourth light shielding strip 922 is greater than the width W4' of the end surface of the first dam 601 facing the first base substrate 11, and the distance L4' between two adjacent fourth light shielding strips 922 arranged in the first direction is greater than or equal to 0.8 times of the size L4 of the second opening in the first direction, and an orthographic projection of the third light shielding strip 921 on the first base substrate 11 overlaps with an orthographic projection of a corresponding second opening on the first base substrate 11. A thickness of each of the third light shielding strip 921 and the fourth light shielding strip 922 is in a range from 0.5 μm to 1 μm, a thickness of the fourth encapsulation layer 82 is 1 μm, and the other parameters of the layers are the same as those of the display panel shown in FIGS. 4A to 4B, which are not repeated herein.

For the display panel in FIGS. 9A to 9B, the second encapsulating layer 81, the filling layer 40, the fourth encapsulating layer 82 and the third encapsulation layer 80 are regarded as a whole which has a refractive index similar to that of the filling layer 40 (i.e., 1.5). In this case, taking the plurality of sub-pixels P arranged in the second direction as an example, as shown in FIG. 9C, when the light emitted from the center of the light emitting device 23 is irradiated onto the upper surface of the first encapsulation layer 30 at an angle greater than or equal to θ2 (i.e., 52°), the total reflection occurs; and when the light emitted from the center of the light emitting device 23 is irradiated onto the upper surface of the first encapsulation layer 30 at an angle of θ4, the light is irradiated onto the edge of the first light shielding strip 911 close to the light emitting device 23. When the light emitted from the center of the light emitting device 23 is irradiated onto the upper surface of the first encapsulation layer 30 at an angle θ3, the refracted light is irradiated onto the edge of the third light shielding strip 921 away from the light emitting device 23. The angle θ3 is greater than the angle θ1 in FIG. 1 and the angle θ4 is about 45°. Therefore, the plurality of sub-pixels P arranged in the second direction shown in FIG. 9A can prevent the crosstalk with respect to the light at an angle in the range from θ1 to θ3 and from 45° to 52°.

Figure 11A:
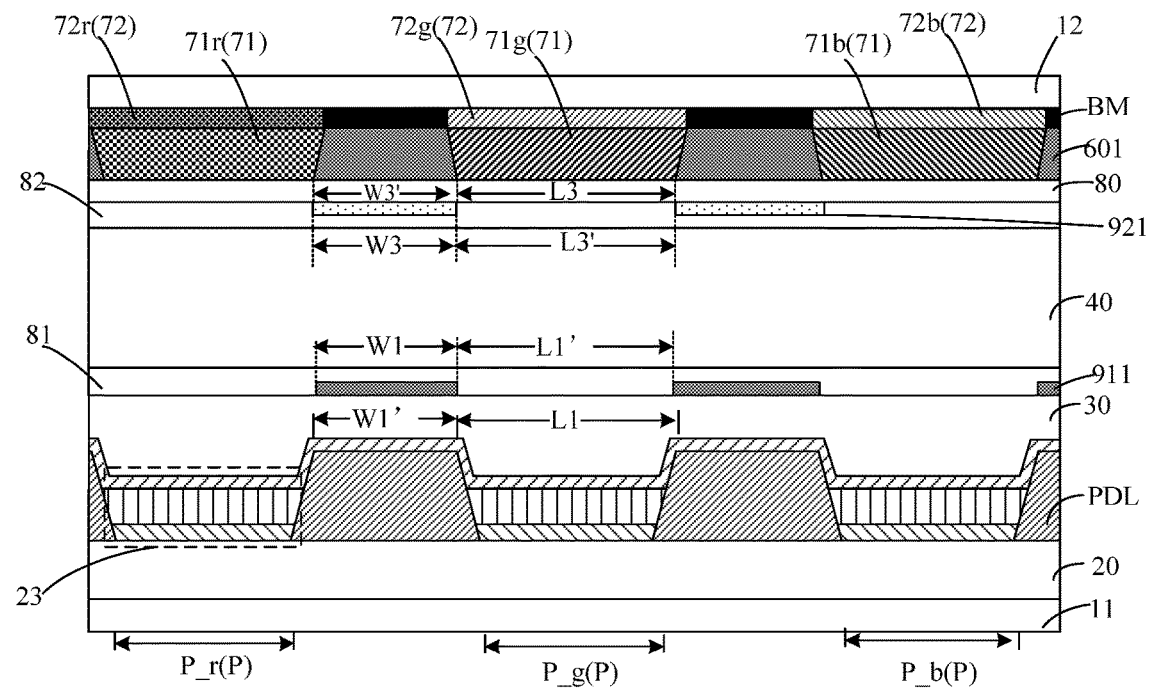
FIG. 11A is a cross-sectional view taken along a line A-A' in FIG. 3 in other embodiments of the present disclosure.
Figure 11B:
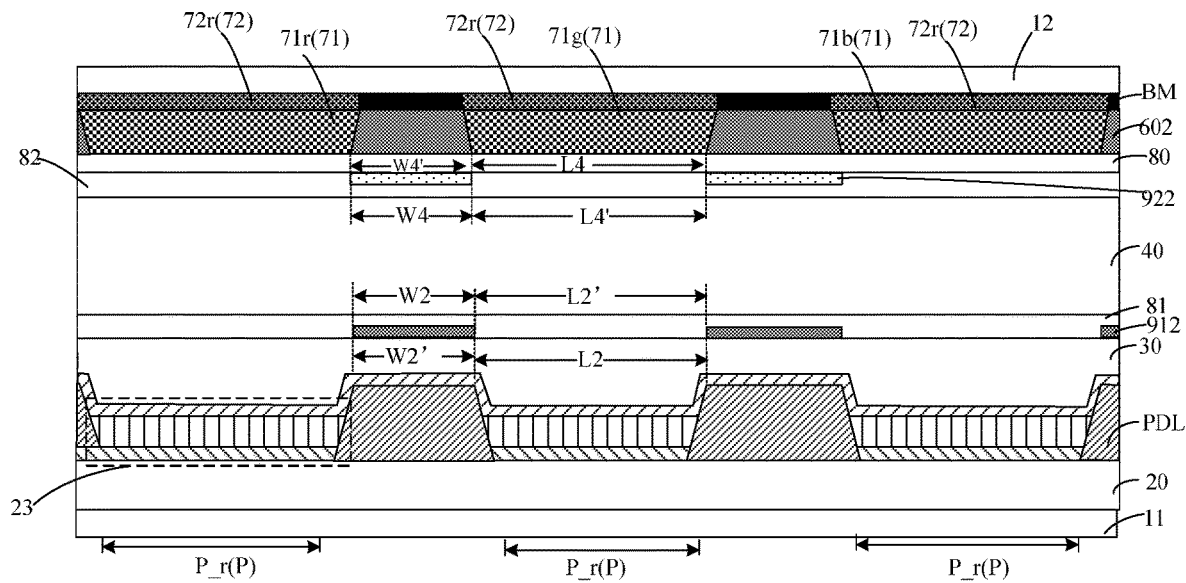
FIG. 11B is a cross-sectional view taken along a line B-B' in FIG. 3 in other embodiments of the present disclosure.
Figure 11C:
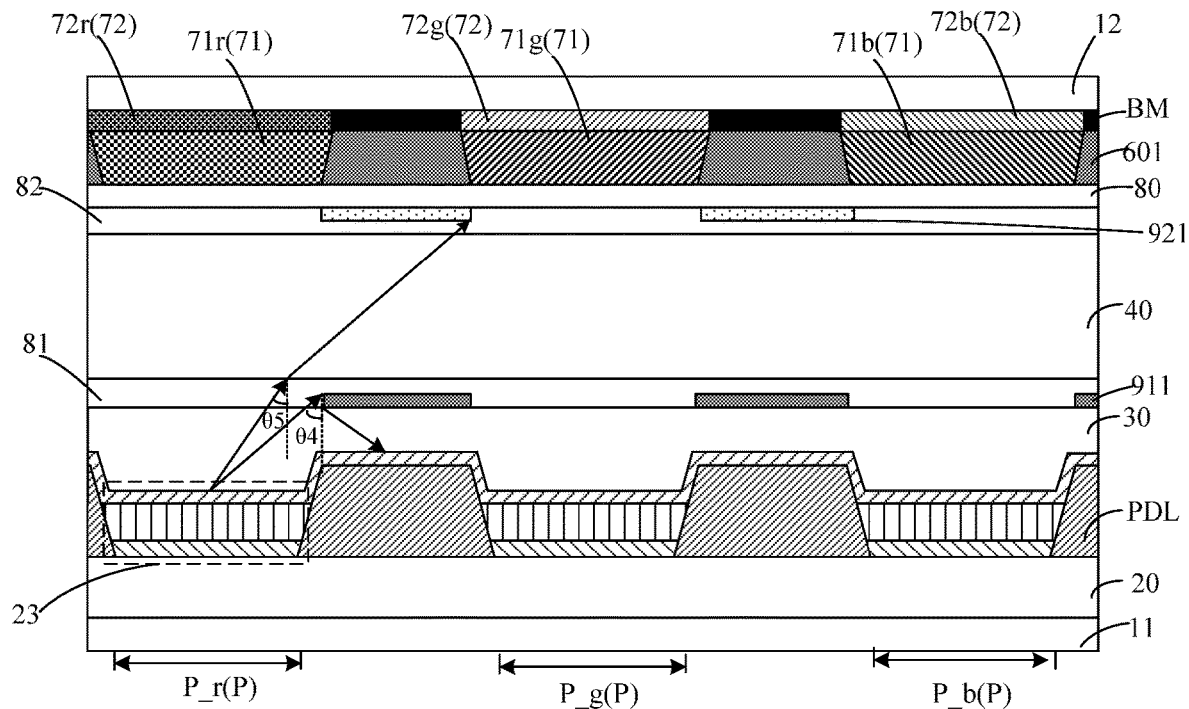
FIG. 11C is a diagram illustrating emergent light rays emitted from the light emitting device of the display panel in FIG. 11A.

FIG. 11A is a cross-sectional view taken along a line A-A' in FIG. 3 in other embodiments of the present disclosure, FIG. 11B is a cross-sectional view taken along a B-B' line in FIG. 3 in other embodiments of the present disclosure, and FIG. 11C is a diagram illustrating emergent light rays emitted from the light emitting device of the display panel in FIG. 11A. The display panel shown in FIGS. 11A to 11B is similar to the display panel shown in FIGS. 9A to 9B except that, in FIGS. 11A to 11B, the width W3 of the third light shielding strip 921 is the same as the width W3' of the first dam 601, a center line of the third light shielding strip 921 in its width direction is aligned with a center line of a corresponding first dam 601 in its width direction; the width W4 of the fourth light shielding strips 922 is the same as the width W4' of the second dam 602, and a center line of the fourth light shielding strips 922 in its width direction is aligned with a center line of a corresponding second dam 602 in its width direction.

Regarding the display panel in FIGS. 11A to 11B, the second encapsulation layer 81, the filling layer 40, the fourth encapsulation layer 82 and the third encapsulation layer 80 are regarded as a whole, which has a refractive index similar to that of the filling layer 40 (i.e., 1.5). In this case, when the light emitted from the center of the light emitting device 23 is irradiated on the upper surface of the first encapsulation layer 30 at an angle of 52° or more, the total reflection occurs. As shown in FIG. 11C, when the light emitted from the center of the light emitting device 23 is irradiated on the upper surface of the first encapsulation layer 30 at an angle of θ4, the light is irradiated on the edge of the first light shielding strip 911 close to the light emitting device 23. When the light emitted from the center of the light emitting device 23 is irradiated on the upper surface of the first encapsulation layer 30 at an angle θ5, the refracted light is irradiated on the edge of the third light shielding strip 921 away from the light emitting device 23. The thickness of the third encapsulation layer 80 is small, so that the angle θ5 is close to the angel θ1 in FIG. 1. That is, the display panel in FIGS. 11A to 11B has substantially the same crosstalk prevention capability as the display panel in FIGS. 4A to 4B, i.e., for a plurality of sub-pixels P arranged in the second direction, the crosstalk with respect to light in the range of 45° to 52° can be prevented.

Figure 12A:
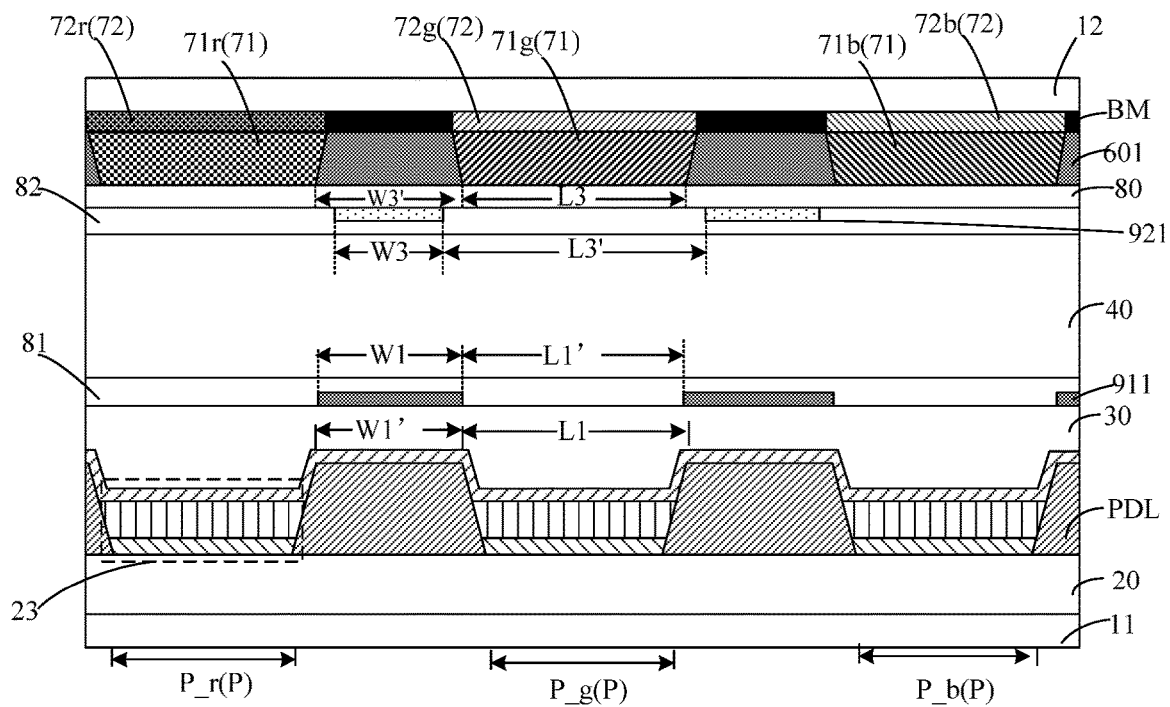
FIG. 12A is a cross-sectional view taken along a line A-A' in FIG. 3 in other embodiments of the present disclosure.
Figure 12B:
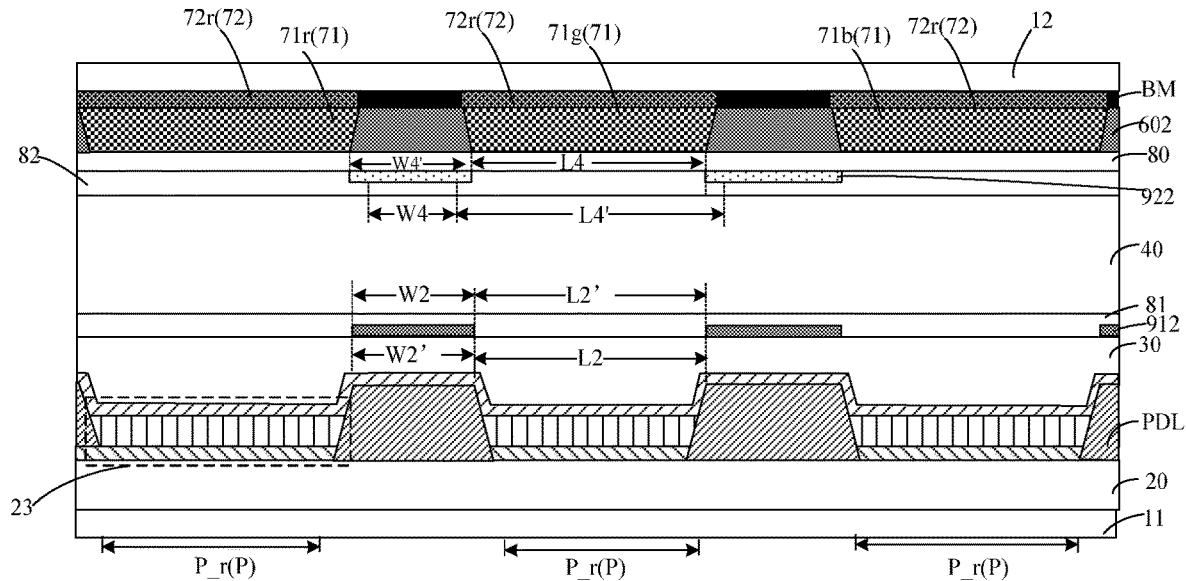
FIG. 12B is a cross-sectional view taken along a line B-B' in FIG. 3 in other embodiments of the present disclosure.
Figure 12C:
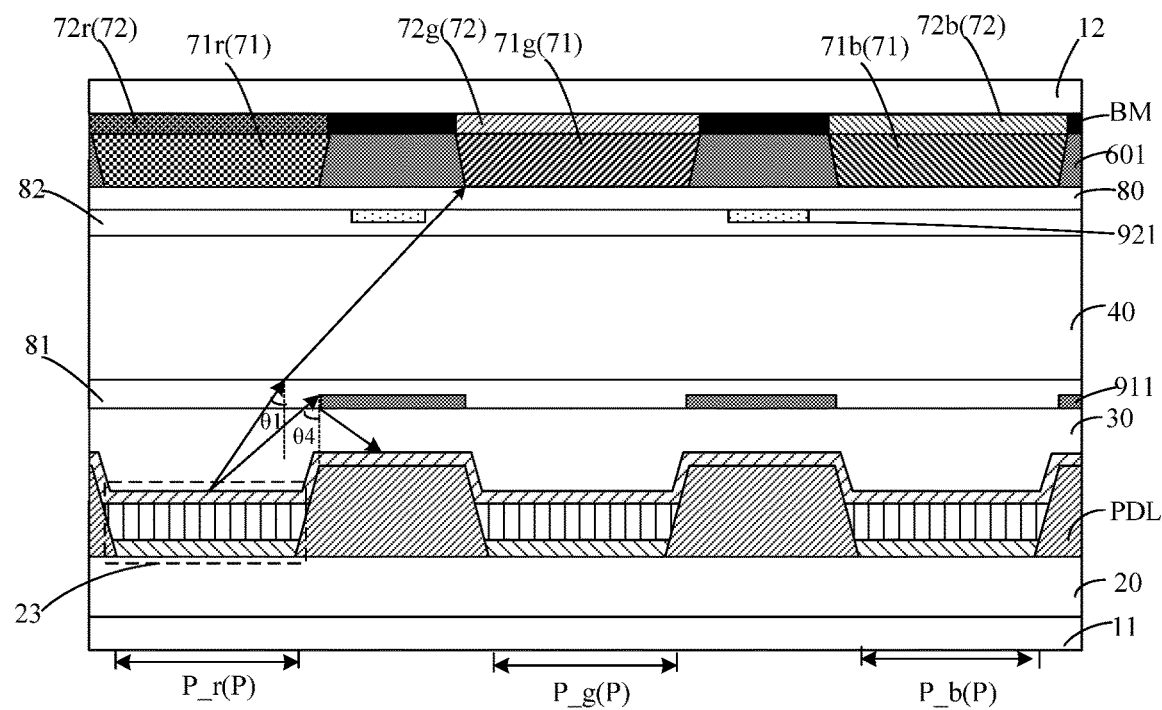
FIG. 12C is a diagram illustrating a light path of light emitted from a light emitting device of a display panel in FIG. 12A.

FIG. 12A is a cross-sectional view taken along a line A-A' in FIG. 3 in other embodiments of the present disclosure, FIG. 12B is a cross-sectional view taken along a line B-B' in FIG. 3 in other embodiments of the present disclosure, and FIG. 12C is a diagram illustrating a light path of light emitted from a light emitting device of a display panel in FIG. 12A. The display panel shown in FIGS. 12A to 12B is similar to the display panel shown in FIGS. 9A to 9B, except that, in FIGS. 12A to 12B, the width W3 of the third light shielding strip 921 is smaller than the width W3' of the first dam 601, and the width W4 of the fourth light shielding strip 922 is smaller than the width W4' of the second dam 602, for example, an orthographic projection of the third light shielding strip 921 on the first base substrate 11 is located within an orthographic projection of the first dam 601 on the first base substrate 11, and an orthographic projection of the fourth light shielding strip 922 on the first base substrate 11 is located within an orthographic projection of the second dam 602 on the first base substrate 11. In this case, the display panel in FIGS. 12A to 12B has the same crosstalk prevention capability as the display panel in FIGS. 4A to 4B, that is, for a plurality of sub-pixels P arranged in the second direction, the crosstalk with respect to light in the range of 45° to 52° can be prevented.

Figure 13A:
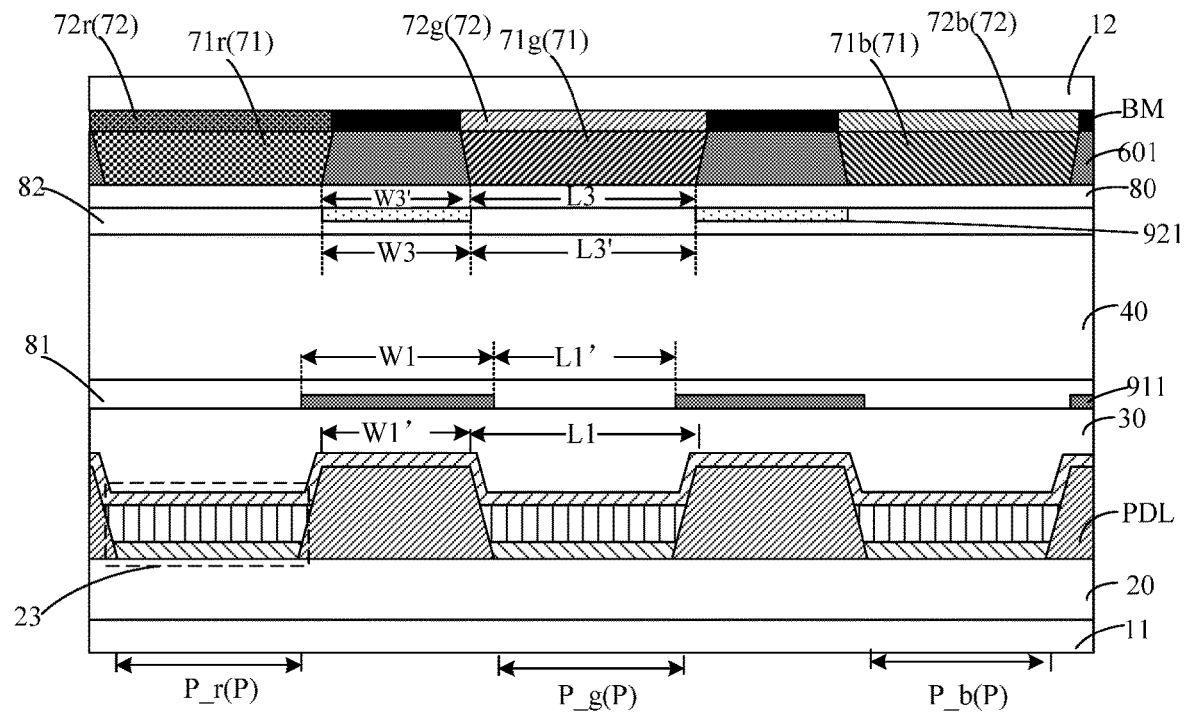
FIG. 13A is a cross-sectional view taken along a line A-A' in FIG. 3 in other embodiments of the present disclosure.
Figure 13B:
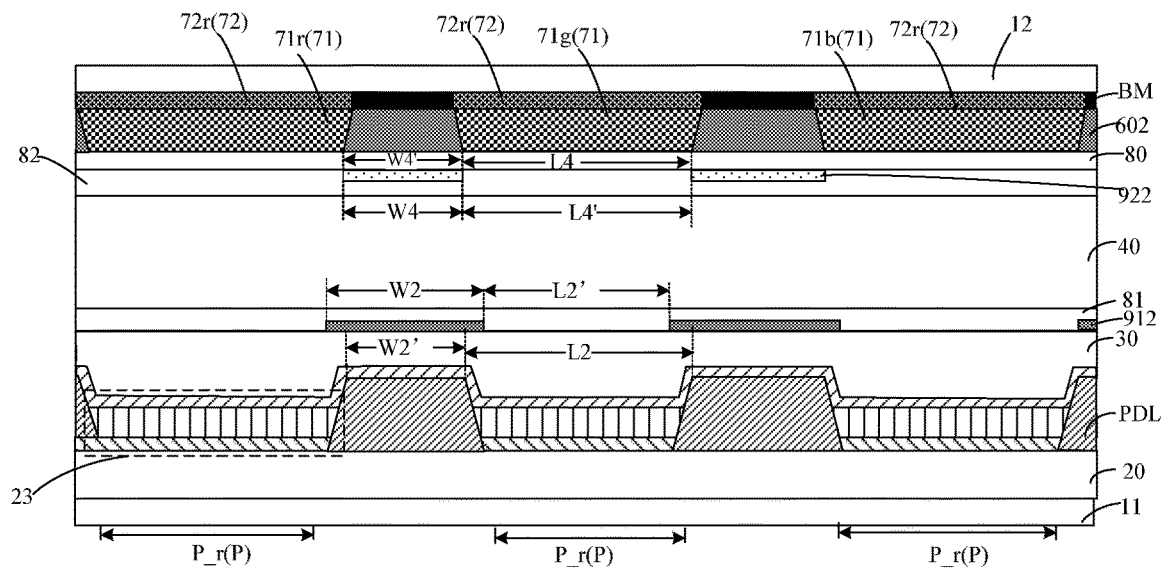
FIG. 13B is a cross-sectional view taken along a line B-B' in FIG. 3 in other embodiments of the present disclosure.
Figure 13C:
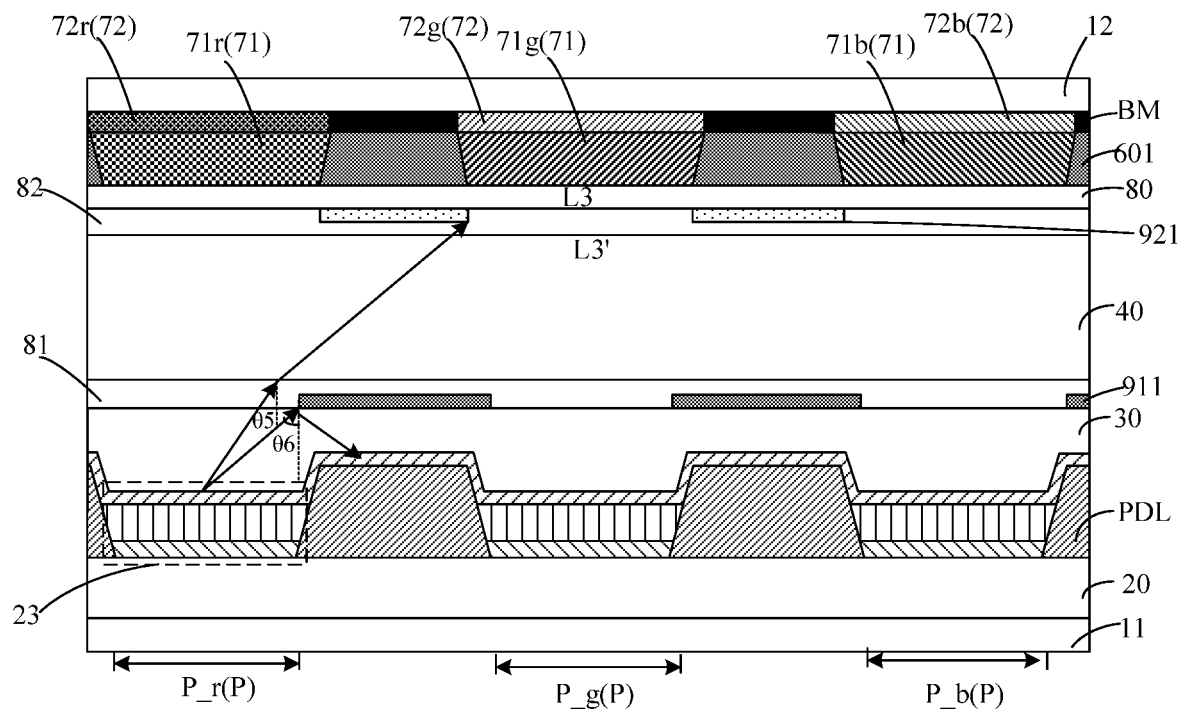
FIG. 13C is a diagram illustrating emergent light rays emitted from the light emitting device of the display panel in FIG. 13A.

FIG. 13A is a cross-sectional view taken along a line A-A' in FIG. 3 in other embodiments of the present disclosure, FIG. 13B is a cross-sectional view taken along a line B-B' in FIG. 3 in other embodiments of the present disclosure, and FIG. 13C is a diagram illustrating emergent light rays emitted from the light emitting device of the display panel in FIG. 13A. The display panel shown in FIGS. 13A to 13B is similar to the display panel shown in FIGS. 11A to 11B, except that in FIGS. 13A to 13B, the width of the first light shielding strip 911 is greater than the width of the top surface of the first barrier RW1, and the width of the second light shielding strip 912 is greater than the width of the top surface of the second barrier RW2. In this case, as shown in FIG. 13C, when the light emitted from the center of the light emitting device 23 is irradiated on the upper surface of the first encapsulation layer 30 at an angle of θ5, the refracted light is irradiated on the edge of the third light shielding strip 921 away from the light emitting device 23. When the light emitted from the center of the light emitting device 23 is irradiated on the upper surface of the first encapsulation layer 30 at an angle of θ6, the light is irradiated onto the edge of the first light shielding strip 911 close to the light emitting device 23. Since the angle θ6 may be calculated to be about 39° based on the parameters of the layers, for a plurality of sub-pixels P arranged in the second direction in FIG. 13A, the crosstalk with respect to light in the range of 39° to 52° can be prevented.

Based on the above analysis, in order to reduce the crosstalk between the sub-pixels P as much as possible and ensure that the brightness of the sub-pixels P is not affected, in some embodiments of the present disclosure, both the first light shielding pattern 91 and the second light shielding pattern 92 may be provided, both an orthographic projection of the first light shielding strips 911 on the first base substrate 11 and an orthographic projection of the second light shielding strips 912 on the first base substrate 11 overlap with an orthographic projection of the first openings on the first base substrate 11, and a distance between any two adjacent second light shielding strips 912 arranged in the first direction is greater than or equal to 0.8 times of a size of the first opening in the first direction, and a distance between any two adjacent first light shielding strips 911 arranged in the second direction is greater than or equal to 0.8 times of a size of the first opening in the second direction. Further, an orthographic projection of the third light shielding strips 921 on the first base substrate 11 is enabled to overlap with an orthographic projection of the second openings on the first base substrate 11, and an orthographic projection of the fourth light shielding strips 922 on the first base substrate 11 is enabled to overlap with an orthographic projection of the second openings on the first base substrate 11.

Figure 14:
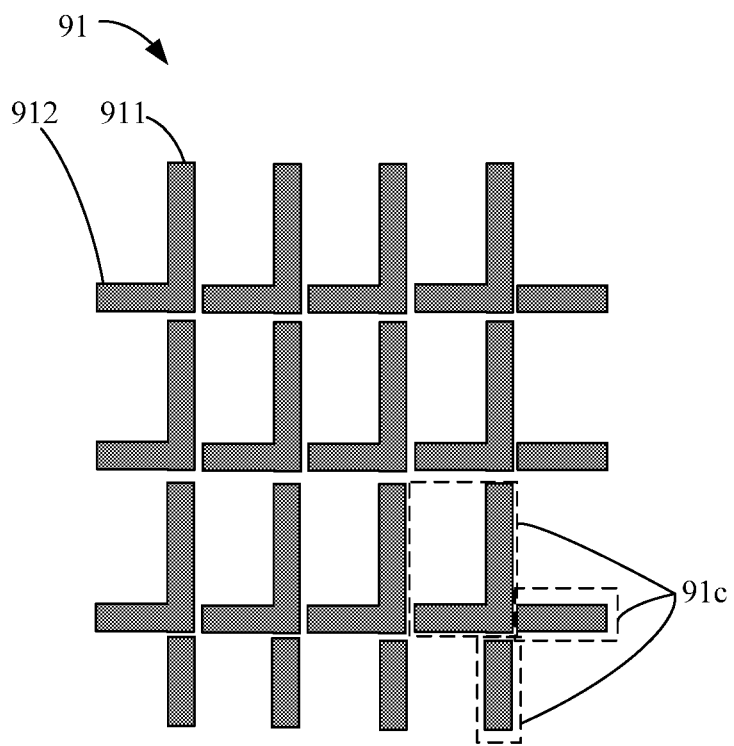
FIG. 14 is a plan view of a first light shielding pattern in some embodiments of the present disclosure.

FIG. 14 is a plan view of a first light shielding pattern in some embodiments of the present disclosure. In a case where the first light shielding pattern is provided on the display panel and the second light shielding pattern is not provided, the first light shielding pattern 91 may have a shape as shown in FIG. 14. Specifically, the first light shielding strip 911 and the second light shielding strip 912 each are made of a conductive material, and the plurality of first light shielding strips 911 and the plurality of second light shielding strips 912 are divided into a plurality of conductive structures. Each of the plurality of conductive structures is also used as a self-capacitance electrode 91c, and each of the self-capacitance electrodes 91c includes, for example, at least one first light shielding strip 911 and/or at least one second light shielding strip 912.

A touch detection chip transmits a touch signal to a respective self-capacitance electrode 91c and receives a feedback signal from the self-capacitance electrode 91c. Each of the self-capacitance electrodes 91c may be connected to the touch detection chip through a touch lead. When no touch operation occurs, a capacitance of each of the self-capacitance electrodes 91c is an initial capacitance value, and the feedback signal to the touch detection chip from the self-capacitance electrode 91c is fixed. When a touch operation is performed on the display panel by a human body or a touch pen, the capacitance of the self-capacitance electrode 91c at the touch position changes, so that the feedback signal changes, and the touch position is determined by the touch detection chip based on the change of the feedback signal.

That is, when the first light shielding pattern 91 is provided in the display panel, the first light shielding pattern 91 can be used for reducing the crosstalk between the sub-pixels, and also for performing a touch detection function.

It should be noted that, the display panel in each of the above embodiments has been described by taking an assembled structure of the display panel as an example, but the structure of the display panel in the present disclosure is not limited thereto. For example, the display panel may be alternatively an On-EL structure (i.e., the filling layer 40 is no longer provided between the color conversion layer and the first encapsulation layer 30, and the third encapsulation layer 80 is located on a side of the color conversion layer away from the first base substrate 11), and in this case, the second light shielding pattern 92 may be omitted.

Figure 15:
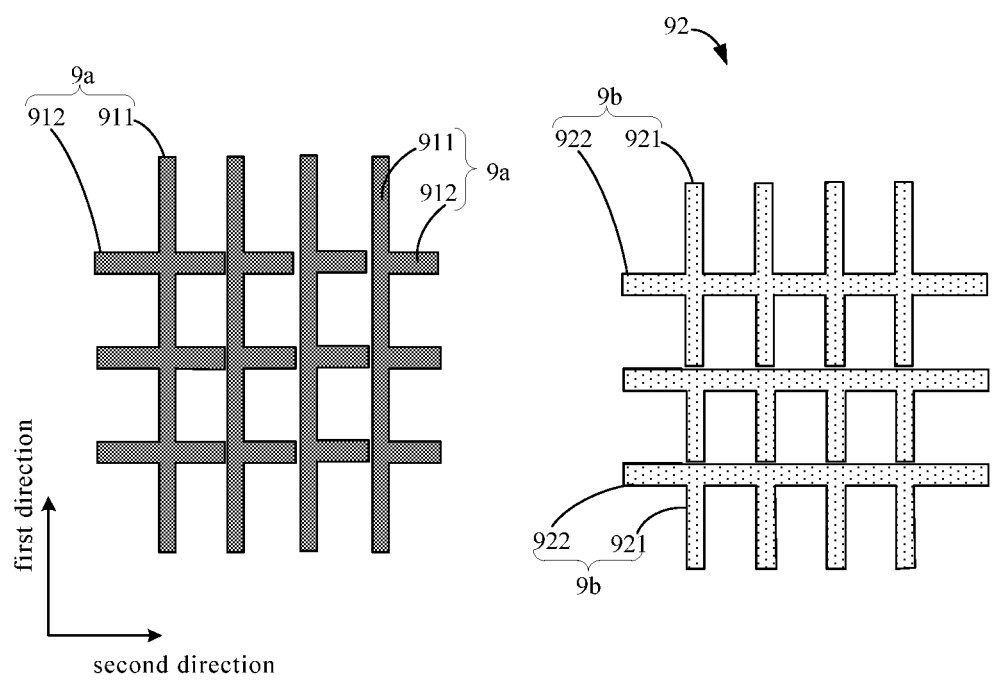
FIG. 15 is a plan view of a first light shielding pattern and a second light shielding pattern in other embodiments of the present disclosure.

FIG. 15 is a plan view of a first light shielding pattern and a second light shielding pattern in other embodiments of the present disclosure. As shown in FIG. 15, when both the first light shielding pattern 91 and the second light shielding pattern 92 are provided in the display panel, the first light shielding pattern 91 is divided into a plurality of first conductive structures, each of which is also used as a first touch electrode 9a; and the second light shielding pattern 92 is divided into a plurality of second conductive structures, each of which is also used as a second touch electrode 9b. A plurality of first touch electrodes 9a are arranged in the second direction, and each of the plurality of first touch electrodes 9a extends in the first direction; and a plurality of second touch electrodes 9b are arranged in the first direction, and each of the plurality of second touch electrodes 9b extends in the second direction. Each of the first touch electrodes 9a may include: at least one first light shielding strip 911 and/or multiple second light shielding strips 912, and each of the second touch electrodes 9b may include: at least one fourth light shielding strip 922 and/or multiple third light shielding strips 921.

An orthographic projection of each of the first touch electrodes 9a on the first base substrate 11 intersects with an orthographic projection of multiple second touch electrodes 9b on the first substrate 11, and an orthographic projection of each of the second touch electrode 9b on the first base substrate 11 intersects with an orthographic projection of multiple first touch electrodes 9a on the first base substrate 11. A mutual capacitance is formed between the first touch electrode 9a and the second touch electrode 9b at a position the orthographic projection of the first touch electrode 9a on the first substrate 11 overlaps with the orthographic projection of the second touch electrode 9b on the first substrate 11. One of the first touch electrode 9a and the second touch electrode 9b is used as a touch driving electrode, and the other of the first touch electrode 9a and the second touch electrode 9b is used as a touch sensing electrode. Taking the first touch electrode 9a as a touch driving electrode and the second touch electrode 9b as a touch sensing electrode as an example, the first touch electrode 9a is connected to a driving terminal of the touch detection chip through a first lead, and the second touch electrode 9b is connected to a sensing terminal of the touch detection chip through a second lead. The touch detection chip sequentially provides driving signals for the first touch electrodes 9a and receives sensing signals from the second touch electrodes 9b. When no touch operation occurs, the sensing signal of each of the second touch electrodes 9b is an initial value, and when a touch operation is performed on the display panel by a human body or a touch pen, the sensing signal of the second touch electrode 9b at a corresponding position changes, and the touch position may be determined by the touch detection chip based on the change of the sensing signal.

In one example, as shown in FIG. 15, the first touch electrode 9a includes: one first light shielding strip 911 and multiple second light shielding strips 912 connected to the first light shielding strip 911. The second touch electrode 9b includes: a fourth light shielding strip 922 and multiple third light shielding strips 921 connected to the fourth light shielding strip 922. Alternatively, the first touch electrode 9a and the second touch electrode 9b may be of other structures.

It should be noted that in the above embodiments, the case where the first light shielding pattern 91 is provided between the first encapsulation layer 30 and the filling layer 40 is taken as an example. Alternatively, the first light shielding pattern may be provided between the filling layer 40 and the color conversion layer.

A display apparatus is further provided in the embodiments of the present disclosure, and the display apparatus includes the display panel in the above embodiments. The display apparatus may be any product or component with a display function, such as an OLED panel, a QLED display panel, a mobile phone, a tablet computer, a television, a display, a notebook computer, a digital photo frame, a navigator or the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A display panel, comprising:
a pixel definition layer on a first base substrate, wherein the pixel definition layer comprises a plurality of barriers, the plurality of barriers comprise a plurality of first barriers extending in a first direction and a plurality of second barriers extending in a second direction, the first direction intersects with the second direction, a plurality of first accommodating portions are defined by the plurality of first barriers and the plurality of second barriers, each of the plurality of first barriers has a first top surface away from the first base substrate, and each of the plurality of the second barriers has a second top surface away from the first base substrate;
a plurality of light emitting devices provided in the plurality of first accommodating portions in one-to-one correspondence, each of the plurality of light emitting devices being configured to emit light of a preset color;
a first encapsulation layer covering the pixel definition layer and the plurality of light emitting devices;
a color conversion layer on a side of the first encapsulation layer away from the first base substrate, wherein the color conversion layer comprises a plurality of light emergent portions, the plurality of light emergent portions are provided in one-to-one correspondence with the plurality of light emitting devices, each of the plurality of light emergent portions is configured to receive light of the preset color and emit light of a same color as the preset color or a different color from the preset color;
a first light shielding pattern between the first encapsulation layer and the color conversion layer, wherein
an orthographic projection of at least a part of each of the plurality of light emitting devices on the first base substrate does not overlap with an orthographic projection of the first light shielding pattern on the first base substrate; the first light shielding pattern comprises a plurality of first light shielding strips extending in the first direction and a plurality of second light shielding strips extending in the second direction, an orthographic projection of the plurality of first light shielding strips on the first base substrate overlaps with an orthographic projection of the plurality of first barriers on the first base substrate, and an orthographic projection of the plurality of second light shielding strips on the first base substrate overlaps with an orthographic projection of the plurality of second barriers on the first base substrate; and
a second barrier between any two adjacent light emitting devices arranged in the first direction corresponds to at least one second light shielding strip, and/or a first barrier between any two adjacent light emitting devices arranged in the second direction correspond to at least one first light shielding strip, a width of the first light shielding strip is greater than or equal to a width of a corresponding first top surface, and a width of the second light shielding strip is greater than or equal to a width of a corresponding second top surface;
wherein each of the plurality of first accommodating portions has a first opening away from the first base substrate, and a width of the first light shielding strip satisfies:

$$W1 \leq W1' + L1*0.4,$$

where W1 is the width of the first light shielding strip, W1' is a width of the first top surface of the first barrier, and L1 is a size of the first opening in the second direction; and a width of the second light shielding strip satisfies:

$$W2 \leq W2' + L2*0.4,$$

where W2 is the width of the second light shielding strip, W2' is a width of the second top surface of the second barrier, and L2 is a size of the first opening in the first direction.

2. The display panel of claim 1, wherein the display panel further comprises a second encapsulation layer covering the first light shielding pattern.

3. The display panel of claim 2, wherein the first encapsulation layer comprises a plurality of encapsulation sub-layers stacked together, and the second encapsulation layer has a same refractive index as a refractive index of an encapsulation sub-layer of the plurality of encapsulation sub-layers farthest from the first base substrate.

4. The display panel of claim 2, wherein a material of the second encapsulation layer and of the encapsulation sub-layer furthest from the first base substrate each comprises any one of: silicon oxide, silicon nitride, or silicon oxynitride; and
wherein the second encapsulation layer has a thickness in a range from 0.5 μm to 1 μm.

5. The display panel of claim 1, wherein the first light shielding pattern has a thickness in a range from 0.5 μm to 1 μm.

6. The display panel of claim 1, wherein the first light shielding pattern is made of a conductive material, the first light shielding pattern is divided into a plurality of conductive structures, and each of the plurality of conductive structures is also used as a self-capacitance electrode.

7. The display panel of claim 1, wherein the plurality of light emergent portions of the color conversion layer comprise a plurality of red light emergent portions, a plurality of green light emergent portions and a plurality of blue light emergent portions, a material of the red light emergent portions comprises a red quantum dot material, a material of the green light emergent portions comprises a green quantum dot material, and a material of the blue light emergent portions comprises a scattering particle material.

8. The display panel of claim 1, further comprising:
a color filter layer on a side of the color conversion layer away from the first substrate, wherein the color filter layer comprises a plurality of color filter portions in one-to-one correspondence with the plurality of light emergent portions, and a color of each of the plurality of color filter portions is the same as a color of light emitted from a corresponding light emergent portion; and
a black matrix on a side of the color conversion layer away from the first base substrate, wherein an orthographic projection of at least a part of each of the plurality of light emergent portions on the first base substrate does not overlap with an orthographic projection of the black matrix on the first base substrate.

9. A display apparatus, comprising the display panel of claim 1.

10. A display panel, comprising:
a pixel definition layer on a first base substrate, wherein the pixel definition layer comprises a plurality of barriers, the plurality of barriers comprise a plurality of first barriers extending in a first direction and a plurality of second barriers extending in a second direction, the first direction intersects with the second direction, a plurality of first accommodating portions are defined by the plurality of first barriers and the plurality of second barriers, each of the plurality of first barriers has a first top surface away from the first base substrate, and each of the plurality of the second barriers has a second top surface away from the first base substrate;
a plurality of light emitting devices provided in the plurality of first accommodating portions in one-to-one correspondence, each of the plurality of light emitting devices being configured to emit light of a preset color;
a first encapsulation layer covering the pixel definition layer and the plurality of light emitting devices;
a color conversion layer on a side of the first encapsulation layer away from the first base substrate, wherein the color conversion layer comprises a plurality of light emergent portions, the plurality of light emergent portions are provided in one-to-one correspondence with the plurality of light emitting devices, each of the plurality of light emergent portions is configured to receive light of the preset color and emit light of a same color as the preset color or a different color from the preset color;
a first light shielding pattern between the first encapsulation layer and the color conversion layer, wherein
an orthographic projection of at least a part of each of the plurality of light emitting devices on the first base substrate does not overlap with an orthographic projection of the first light shielding pattern on the first base substrate; the first light shielding pattern comprises a plurality of first light shielding strips extending in the first direction and a plurality of second light shielding strips extending in the second direction, an orthographic projection of the plurality of first light shielding strips on the first base substrate overlaps with an orthographic projection of the plurality of first barriers on the first base substrate, and an orthographic projection of the plurality of second light shielding strips on the first base substrate overlaps with an orthographic projection of the plurality of second barriers on the first base substrate; and
a second barrier between any two adjacent light emitting devices arranged in the first direction corresponds to at least one second light shielding strip, and/or a first barrier between any two adjacent light emitting devices arranged in the second direction correspond to at least one first light shielding strip, a width of the first light shielding strip is greater than or equal to a width of a corresponding first top surface, and a width of the second light shielding strip is greater than or equal to a width of a corresponding second top surface, wherein the display panel further comprises:
a filling layer between the first light shielding pattern and the color conversion layer; and
a second light shielding pattern between the color conversion layer and the filling layer, wherein an orthographic projection of the second light shielding pattern on the first base substrate overlaps with an orthographic projection of the plurality of barriers on the first base substrate, and an orthographic projection of at least a part of each of the plurality of light emitting devices on the first base substrate does not overlap with the orthographic projection of the second light shielding pattern on the first base substrate; and
wherein a second encapsulation layer is provided between the first light shielding pattern and the filling layer, and a refractive index of the second encapsulation layer is greater than a refractive index of the filling layer.

11. The display panel of claim 10, further comprising an accommodating structure layer, wherein
the accommodating structure layer comprises a plurality of first dams extending in the first direction and a plurality of second dams extending in the second direction, the plurality of first dams intersect with the plurality of second dams to define a plurality of second accommodating portions, and the plurality of light emergent portions are provided in the plurality of second accommodating portions in one-to-one correspondence;
the second light shielding pattern comprises a plurality of third light shielding strips extending in the first direction and a plurality of fourth light shielding strips extending in the second direction, an orthographic projection of the plurality of third light shielding strips on the first base substrate overlaps with an orthographic projection of the plurality of first dams on the first base substrate, and an orthographic projection of the plurality of fourth light shielding strips on the first base substrate overlaps with an orthographic projection of the plurality of second dams on the first base substrate; and
a second dam between any two adjacent light emergent portions in the first direction corresponds to at least one third light shielding strip, and/or a first dam between any two adjacent light emergent portions in the second direction corresponds to at least one fourth light shielding strip.

12. The display panel of claim 11, wherein each of the plurality of second accommodating portions has a second opening facing the first base substrate, the first dam has a first bottom surface facing the first base substrate, and the second dam has a second bottom surface facing the first base substrate;
a width of the third light shielding strip satisfies:

$$W3' \le W3 \le W3' + 0.4*L3,$$

where W3 is the width of the third light shielding strip, W3' is a width of the first bottom surface of the first dam, and L3 is a size of the second opening in the second direction; and a width of the fourth shading strip satisfies:

$$W4' \leq W4 \leq W4'+0.4*L4,$$

where W4 is the width of the fourth light shielding strip, W4' is a width of the second bottom surface of the second dam, and L4 is a size of the second opening in the first direction.

13. The display panel of claim 10, wherein the second light shielding pattern has a thickness in a range from 0.5 μm to 1 μm.

14. The display panel of claim 10, wherein the display panel further comprises:
   a second base substrate, wherein the color conversion layer is provided on a side of the second base substrate close to the first base substrate; and
   a third encapsulation layer on a side of the color conversion layer away from the second base substrate, and used for encapsulating the color conversion layer;
   wherein the second light shielding pattern is provided between the third encapsulation layer and the filling layer.

15. The display panel of claim 14, further comprising a fourth encapsulation layer on a side of the second light shielding pattern away from the third encapsulation layer.

16. The display panel of claim 15, wherein the fourth encapsulation layer and the third encapsulation layer have a same refractive index.

17. The display panel of claim 16, wherein a material of the fourth encapsulation layer and a material of the third encapsulation layer each comprises any one of: silicon oxide, silicon nitride, or silicon oxynitride; and
   the fourth encapsulating layer has a thickness in a range from 0.5 μm to 1 μm.

18. A display apparatus, comprising the display panel of claim 10.

19. A display panel, comprising:
   a pixel definition layer on a first base substrate, wherein the pixel definition layer comprises a plurality of barriers, the plurality of barriers comprise a plurality of first barriers extending in a first direction and a plurality of second barriers extending in a second direction, the first direction intersects with the second direction, a plurality of first accommodating portions are defined by the plurality of first barriers and the plurality of second barriers, each of the plurality of first barriers has a first top surface away from the first base substrate, and each of the plurality of the second barriers has a second top surface away from the first base substrate;
   a plurality of light emitting devices provided in the plurality of first accommodating portions in one-to-one correspondence, each of the plurality of light emitting devices being configured to emit light of a preset color;
   a first encapsulation layer covering the pixel definition layer and the plurality of light emitting devices;
   a color conversion layer on a side of the first encapsulation layer away from the first base substrate, wherein the color conversion layer comprises a plurality of light emergent portions, the plurality of light emergent portions are provided in one-to-one correspondence with the plurality of light emitting devices, each of the plurality of light emergent portions is configured to receive light of the preset color and emit light of a same color as the preset color or a different color from the preset color;
   a first light shielding pattern between the first encapsulation layer and the color conversion layer, wherein an orthographic projection of at least a part of each of the plurality of light emitting devices on the first base substrate does not overlap with an orthographic projection of the first light shielding pattern on the first base substrate; the first light shielding pattern comprises a plurality of first light shielding strips extending in the first direction and a plurality of second light shielding strips extending in the second direction, an orthographic projection of the plurality of first light shielding strips on the first base substrate overlaps with an orthographic projection of the plurality of first barriers on the first base substrate, and an orthographic projection of the plurality of second light shielding strips on the first base substrate overlaps with an orthographic projection of the plurality of second barriers on the first base substrate; and a second barrier between any two adjacent light emitting devices arranged in the first direction corresponds to at least one second light shielding strip, and/or a first barrier between any two adjacent light emitting devices arranged in the second direction correspond to at least one first light shielding strip, a width of the first light shielding strip is greater than or equal to a width of a corresponding first top surface, and a width of the second light shielding strip is greater than or equal to a width of a corresponding second top surface, wherein the display panel further comprises:
a filling layer between the first light shielding pattern and the color conversion layer; and
a second light shielding pattern between the color conversion layer and the filling layer, wherein an orthographic projection of the second light shielding pattern on the first base substrate overlaps with an orthographic projection of the plurality of barriers on the first base substrate, and an orthographic projection of at least a part of each of the plurality of light emitting devices on the first base substrate does not overlap with the orthographic projection of the second light shielding pattern on the first base substrate;

wherein the display panel further comprises an accommodating structure layer,
the accommodating structure layer comprises a plurality of first dams extending in the first direction and a plurality of second dams extending in the second direction, the plurality of first dams intersect with the plurality of second dams to define a plurality of second accommodating portions, and the plurality of light emergent portions are provided in the plurality of second accommodating portions in one-to-one correspondence;

the second light shielding pattern comprises a plurality of third light shielding strips extending in the first direction and a plurality of fourth light shielding strips extending in the second direction, an orthographic projection of the plurality of third light shielding strips on the first base substrate overlaps with an orthographic projection of the plurality of first dams on the first base substrate, and an orthographic projection of the plurality of fourth light shielding strips on the first base substrate overlaps with an orthographic projection of the plurality of second dams on the first base substrate; and a second dam between any two adjacent light emergent portions in the first direction corresponds to at least one third light shielding strip, and/or a first dam between any two adjacent light emergent portions in the second direction corresponds to at least one fourth light shielding strip, wherein the first light shielding pattern and the second light shielding pattern each are made of a conductive material;

the first light shielding pattern is divided into a plurality of first conductive structures arranged in the second direction, different first conductive structures are insulated and spaced apart from each other; and the plurality of first conductive structures extend in the first direction and also used as first touch electrodes, respectively;

the second light shielding pattern is divided into a plurality of second conductive structures arranged in the first direction, different second conductive structures are insulated and spaced apart from each other; and the plurality of second conductive structures extends in the second direction and also used as second touch electrodes, respectively; and an orthographic projection of each of the first touch electrodes on the first base substrate overlaps with an orthographic projection of multiple second touch electrodes on the first base substrate, and an orthographic projection of each of second touch electrodes on the first base substrate overlaps with an orthographic projection of multiple first touch electrodes on the second base substrate.

20. A display apparatus, comprising the display panel of claim 19.

* * * * *